(12) United States Patent
Ide et al.

(10) Patent No.: US 8,193,058 B2
(45) Date of Patent: Jun. 5, 2012

(54) METHOD OF MANUFACTURING SEMICONDUCTOR DEVICE

(75) Inventors: Yugo Ide, Yokkaichi (JP); Minori Kajimoto, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/638,754

(22) Filed: Dec. 15, 2009

(65) Prior Publication Data

US 2010/0093143 A1 Apr. 15, 2010

Related U.S. Application Data

(62) Division of application No. 12/146,009, filed on Jun. 25, 2008, now abandoned.

(30) Foreign Application Priority Data

Jun. 26, 2007 (JP) ................................. 2007-167601

(51) Int. Cl.
 *H01L 21/336* (2006.01)
(52) U.S. Cl. ........ 438/261; 438/257; 438/128; 257/316; 257/390; 257/E27
(58) Field of Classification Search .................. 257/390, 257/316, 314; 438/217, 266, 216, 261, 257, 438/128
See application file for complete search history.

(56) References Cited

U.S. PATENT DOCUMENTS

| 5,072,276 | A | 12/1991 | Malhi et al. |
| 6,777,294 | B2 * | 8/2004 | Park .............................. 438/264 |
| 7,195,968 | B2 * | 3/2007 | Kamiya et al. ................. 438/217 |
| 7,241,651 | B2 | 7/2007 | Miwa |
| 2005/0051831 | A1 * | 3/2005 | Kajimoto et al. ............. 257/314 |
| 2005/0062094 | A1 * | 3/2005 | Miwa .............................. 257/316 |
| 2005/0287793 | A1 | 12/2005 | Blanchet et al. |
| 2006/0176738 | A1 * | 8/2006 | Lee et al. .................. 365/185.28 |
| 2006/0214211 | A1 | 9/2006 | Miyazaki |
| 2007/0034929 | A1 * | 2/2007 | Hwang et al. ................. 257/314 |
| 2007/0132007 | A1 * | 6/2007 | Kamigaichi et al. .......... 257/316 |
| 2007/0138576 | A1 * | 6/2007 | Mizukami et al. ............. 257/390 |
| 2007/0196983 | A1 * | 8/2007 | Hong ............................. 438/257 |
| 2008/0246075 | A1 | 10/2008 | Matsuno |

FOREIGN PATENT DOCUMENTS

| JP | 2-185025 | 7/1990 |
| JP | 2001-196477 | 7/2001 |
| JP | 2001-210809 | 8/2001 |
| JP | 2004-356491 | 12/2004 |

* cited by examiner

*Primary Examiner* — Fernando L Toledo
*Assistant Examiner* — Mark A Laurenzi
(74) *Attorney, Agent, or Firm* — Oblon, Spivak, McClelland, Maier & Neustadt, L.L.P.

(57) ABSTRACT

A semiconductor device including a semiconductor substrate; a plurality of memory cell transistors aligned in a predetermined direction on the semiconductor substrate, each memory cell transistor provided with a first gate electrode including a floating gate electrode comprising a polycrystalline silicon layer of a first thickness, a control gate electrode provided above the floating gate electrode, and an inter-gate insulating film between the floating and the control gate electrode; a pair of select gate transistors on the semiconductor substrate with a pair of second gate electrodes neighboring in alignment with the first gate electrode, each second gate electrode including a lower-layer gate electrode comprising the polycrystalline silicon layer of the first thickness, an upper-layer gate electrode provided above the lower-layer gate electrode; a polyplug of the first thickness situated between the second gate electrodes of the pair of select gate transistors; and a metal plug provided on the polyplug.

6 Claims, 25 Drawing Sheets

METHOD OF MANUFACTURING SEMICONDUCTOR DEVICE

CROSS-REFERENCE TO RELATED APPLICATIONS

This application is a division of and claims the benefit of priority under 35 U.S.C. §120 from U.S. Ser. No. 12/146,009 filed Jun. 25, 2008, and claims the benefit of priority under 35 U.S.C. §119 from Japanese Patent Application No. 2007-167601 filed Jun. 26, 2007, the entire contents of each of which are incorporated herein by reference.

FIELD

The present disclosure relates to a semiconductor device having conductive layers for gate electrodes formed periodically on a gate insulating film overlying a semiconductor substrate. The present disclosure also relates to a method of manufacturing such semiconductor device.

BACKGROUND

A flash memory is increasing its application to multimedia cards by its capability to retain information without power supply. A typical flash memory is illustrated in figures such as FIGS. 6 and 77 of JP 2001-196477 A, where integration is achieved by configuring multiple memory cells having matrix-aligned stacked gate electrodes overlying a semiconductor substrate via a gate insulating film.

As further described in the NAND flash memory disclosed in JP 2001-196477 A, select gate electrodes and floating gate electrodes are formed periodically in the memory cell region. Contact regions are formed on the surface layer of the semiconductor substrate, more specifically, beside the select and floating gate electrodes. Contact plugs are formed on the semiconductor substrate to allow application of voltage on the contact regions.

One exemplary approach in obtaining such configuration is forming contact plugs between a plurality of select gate electrodes which have been formed periodically along with floating gate electrodes over a semiconductor substrate via gate insulating film. The select gate and floating gate electrode structures, being formed at constant periodic spacing, provides lithography process margin. However, when the select gate electrodes and the floating gate electrodes must be formed in non-periodic spacing, lithography process margin cannot be obtained.

Increasing requirement for device integration and shrinking of design rules results in ever narrower gaps between the select gate electrodes and between the floating gate electrodes. Thus, it is becoming more and more difficult to obtain lithography process margin. Such conditions render dimension control of select gate electrode difficult, which may result in degradation in select gate electrode characteristics. The above described problems does not only concern flash memories provided with floating gate electrodes and/or select gate electrodes but also semiconductor devices with periodic formation of gate electrodes on the semiconductor substrate via gate insulating film.

SUMMARY

According to an aspect of the disclosure, there is provided a semiconductor device, comprising a semiconductor substrate having an upper surface; a plurality of memory cell transistors aligned in a predetermined direction on the semiconductor substrate, the memory cell transistors being provided with a first gate electrode including a floating gate electrode comprising a polycrystalline silicon layer of a first thickness, a control gate electrode provided above the floating gate electrode, and an inter-gate insulating film provided between the floating gate electrode and the control gate electrode; a pair of select gate transistors provided on the semiconductor substrate, the select transistors being provided with a second gate electrode neighboring in alignment with the first gate electrode, the second gate electrode including a lower-layer gate electrode comprising the polycrystalline silicon layer of the first thickness, an upper-layer gate electrode provided above the lower-layer gate electrode; a polyplug of the first thickness provided on the semiconductor substrate situated between the second gate electrodes of the pair of select gate transistors; and a metal plug provided on the polyplug.

According to an aspect of the disclosure, there is provided a method of manufacturing a semiconductor device, forming a gate insulating film on a semiconductor substrate; simultaneously forming a plurality of first conductive layers for a plurality of first gate electrodes and a plurality of second conductive layers for a plurality of second gate electrodes on the gate insulating film, the first conductive layers being formed periodically at a first spacing and the second conductive layer being formed in alignment with the first gate electrode at periodic spacing of a second spacing greater than the first spacing and further simultaneously forming a third conductive layer for a contact plug that structurally contact the semiconductor substrate situated between the plurality of second conductive layers spaced apart by the second spacing.

According to an aspect of the disclosure, there is provided a method manufacturing a semiconductor device comprising forming a gate insluting film on a memory cell transistor forming region, a select gate transistor forming region neighboring the memory cell transistor forming region, and a contact region neighboring the select transistor region respectively defined on a semiconductor substrate; removing the gate insulating film on the contact region; forming a first polycrystalline silicon layer having a first thickness on the contact region, the gate insulating film of the memory cell transistor forming region and the select gate transistor forming region; forming a second polycrystalline silicon layer having a second thickness on the gate insulating film formed on the first polycrystalline silicon layer formed on the memory cell transistor forming region, the select gate transistor forming region and the contact region; removing the first and the second polycrystalline silicon layers and the inter-gate insulating film situated at boundaries between the memory cell transistor forming region and the select gate transistor forming region, and between the select gate transistor forming region and the contact region; removing the second polycrystalline silicon layer and the inter-gate insulating film over the contact region to expose an upper surface of the first polycrystalline silicon layer; and forming a metal plug on the exposed upper surface of the first polycrystalline silicon layer.

BRIEF DESCRIPTION OF THE DRAWINGS

Other objects, features and advantages of the present disclosure will become clear upon reviewing the following description of the embodiment of the present disclosure with reference to the accompanying drawings, in which, FIG. 1 partially illustrates an electrical configuration of a memory cell array described in one exemplary embodiment of the present disclosure.

DETAILED DESCRIPTION

One exemplary embodiment employing a semiconductor device of the present disclosure to a NAND flash memory will be described with reference to the accompanying drawings. References are made to the drawings hereinafter with identical or similar reference symbols when referring to identical or similar elements. Of note is that the drawings are merely schematic and the relation between the thickness and the planar dimensions and the ratios in thickness of each layer differs from the actual ratios. However, ratios of planar dimensions (Y-directional dimension, in particular) between elements such as gates SG and MG and a contact plugs CB, constituting the features of the present exemplary embodiments are substantially consistent with the actual ratios.

Figure 1:
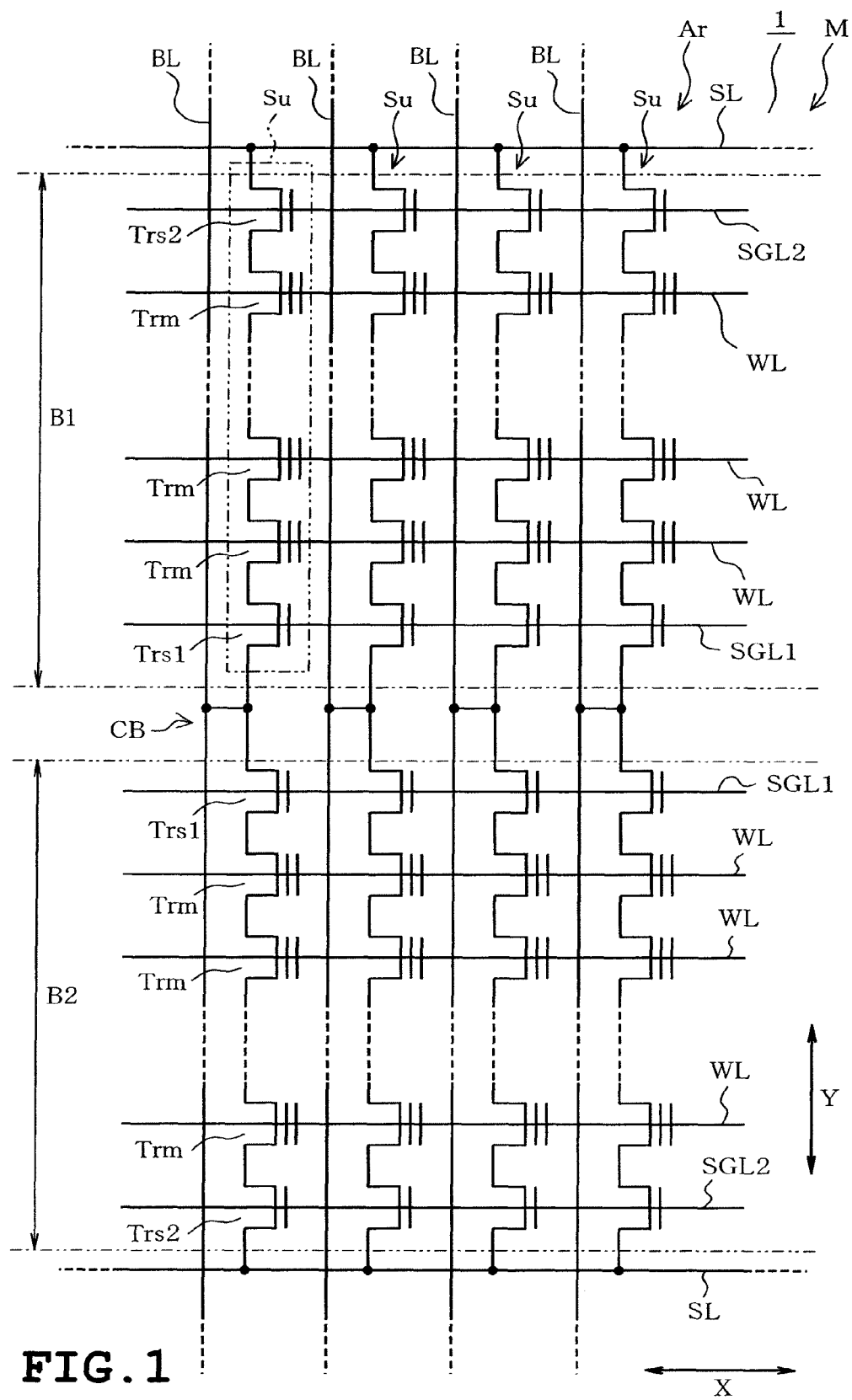
Figure 2:
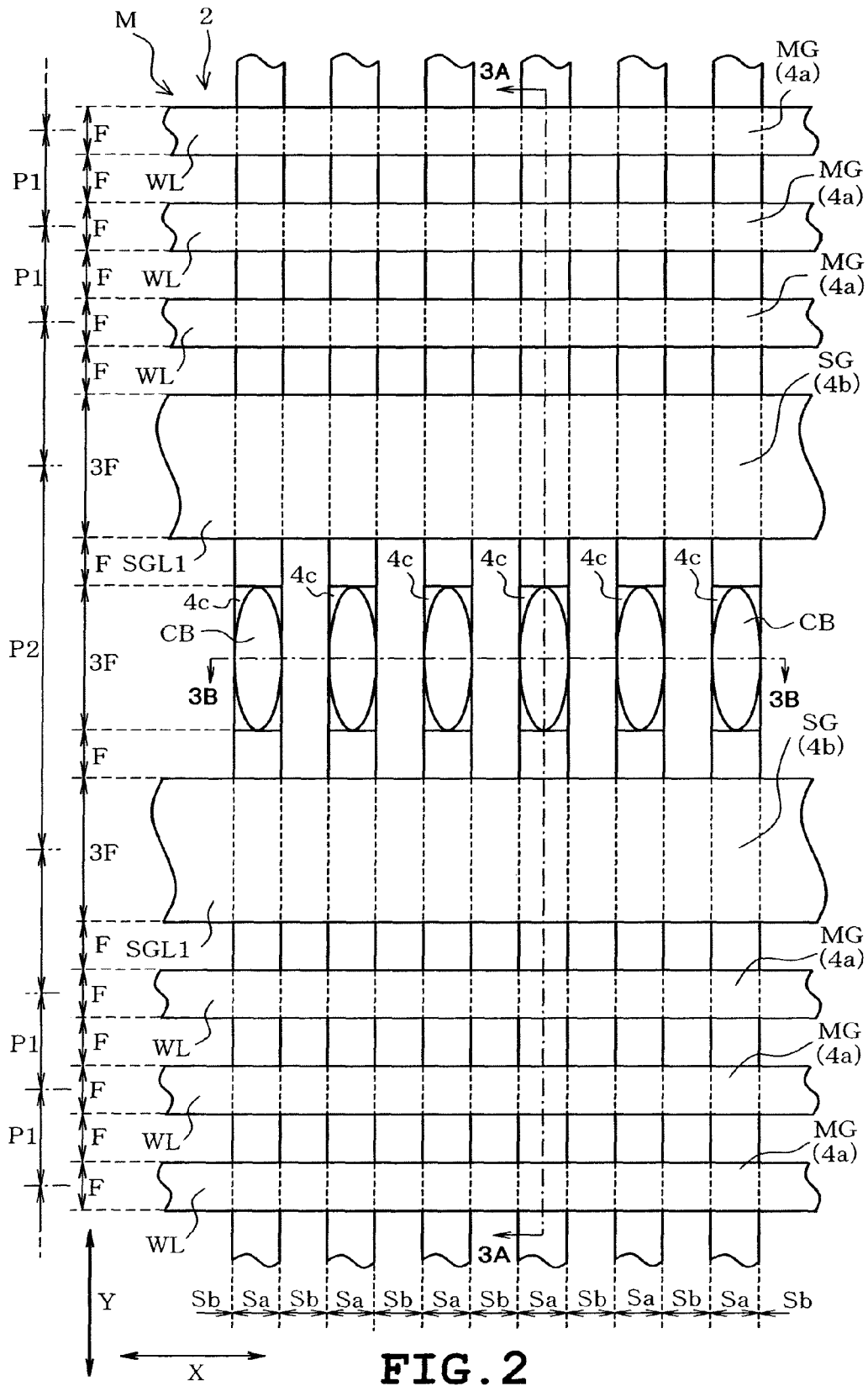
FIG. 2 is a schematic plan view partially illustrating a structure within a memory cell region.

FIG. 1 partially illustrates an equivalent circuit of a memory cell array within a memory cell region of a NAND flash memory. FIG. 2 is a partial schematic view of the memory cell region in plan view. FIG. 3C schematically illustrates a vertical cross sectional view of a transistor within a peripheral circuit region.

NAND flash memory 1 known as a typical semiconductor device, includes a memory cell region M and a peripheral circuit region (refer to FIG. 3C). Memory cell region M, as shown in FIG. 1, includes a memory cell array Ar; whereas peripheral circuit region P, as shown in FIG. 3C, includes a peripheral circuit transistor TrP for driving memory cell array Ar and effecting other operations. The peripheral circuit is provided for reading, writing, and deleting data stored in the memory cell.

Memory cell array Ar within memory cell region M of NAND flash memory 1 is configured by a matrix of NAND cell units Su. NAND cell unit Su is constituted by two (a plurality of) select gate transistors Trs1 and Trs2, and a plurality of memory cell transistors Trm (32 for example: $n^{th}$ power of 2 (n is a positive integer)) connected in series between the two select gate transistors Trs1 and Trs2. The plurality of neighboring memory cell transistors Trm shares source/drain regions (not shown in FIG. 2) within a single NAND cell unit Su.

Referring to FIG. 1, memory cell transistors Trm aligned in an X-direction (word line direction) are connected to a common word line (control gate line) WL. Also, select gate transistors Trs1 aligned in the X-direction in FIG. 1 are connected to a common select gate line SGL1. Similarly, select gate transistors Trs2 are connected to a common select gate line SGL2.

A bit line contact CB is connected to a drain region of select gate transistor Trs1. Bit line contact CB is connected to a bit line BL extending in the Y-direction (corresponding to the bit line direction) orthogonal to the X-direction indicated in FIG. 1. Select gate transistors Trs2 are connected to a source line SL extending in the X-direction as viewed in FIG. 1 via the source region.

As shown in FIG. 1, a plurality of NAND cell units Su aligned in the X-direction constitute blocks B1 which are aligned in the Y-direction. FIG. 2 shows block B2, identical in structure to block B1, being disposed Y-directionally adjacent to block B1. Data is deleted, read, and written in blocks (B1, B2).

FIG. 2 is a plan view schematically indicating a layout of a portion of memory cell region M. STI (shallow trench isolation) serving as an element isolation region Sb is formed to extend in the Y-direction as viewed in FIG. 2. Element isolation region Sb are spaced at predetermined intervals in the X-direction orthogonal to the Y-direction to form active regions Sa along the Y-direction as viewed in FIG. 2 isolated in the X-direction.

A plurality of word lines WL connecting the memory cell transistors Trm are formed along the direction (X-direction) orthogonal to the direction in which active region Sa extends. Each word line WL has a Y-directional width equal to Y-directional spacing F between the word lines WL. A gate electrode MG of memory cell transistor Trm is formed on an active area Sa located at the crossover with word line WL. Gate electrodes MG are disposed on active area Sa extending in the Y-direction formed at predetermined spacing in the X-direction. As viewed in the Y-direction, gate electrodes MG are disposed on active area Sa by spacing F in the Y-direction. Thus, gate electrodes MG are formed within memory cell region M in matrix arrangement.

Also, select gate lines SGL1 are formed along the X-direction as viewed in FIG. 2 in parallel with word line WL. The Y-directional width of select gate line SGL1 is triple (3F) of word line WL width F. The spacing between select gate line SGL1 and word line WL is equal to the spacing between word lines WL. Bit line contacts CB are formed on the active region Sa between the pair of select gate lines SGL1.

Bit line contact CB is formed on active area Sa interposing the pair of select gate lines SGL1 and along the X-direction as viewed in FIG. 2. The Y-directional width of a polycrystalline silicon layer 4c is configured equal to width 3F of select gate line SGL1. Further, spacing between polycrystalline silicon layer 4c and select gate line SGL1 is configured equal to spacing F between word lines WL.

Referring to FIG. 1, bit line contact CB is formed between block B1 and block B2 neighboring each other in the Y-direction and is connected to bit line BL serving as data line.

Referring to FIG. 2, word line WL extends in the X-direction so as to extend over a plurality of active areas Sa and element isolation regions Sb to connect control gate electrodes CG constituting gate electrodes MG (refer to FIG. 3A) aligned in the X-direction.

At each crossover of active area Sa and select gate lines SGL1 is formed a select gate electrode SG of select gate transistor Trs1, each select gate electrode SG being connected by select gate line SGL1.

Figure 3A:
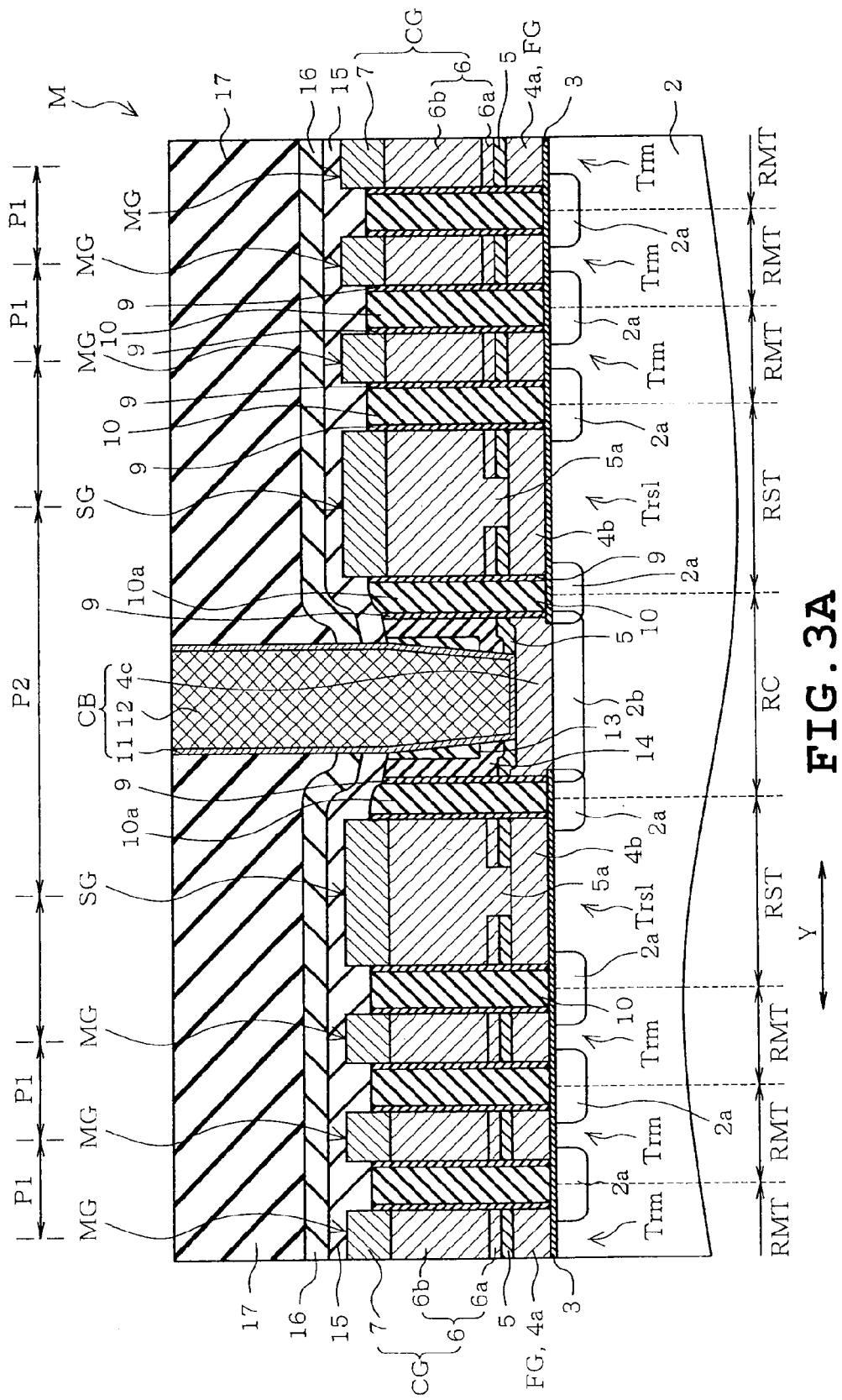
FIG. 3A is a schematic vertical cross-sectional of a cell unit illustrated in FIG. 2, taken along line 3A-3A in FIG. 2.

FIG. 3A schematically illustrates a vertical cross-sectional view of a portion taken along line 3A-3A of FIG. 2, and also schematically illustrates a cross section of select gate line SGL1 and word line WL centering on bit line contact CB.

As can be seen in FIG. 3A, memory cell transistor Trm includes a gate electrode MG configured by laminating a silicon oxide layer 3, a floating gate electrode FG, an ONO film 5, and a control gate electrode CG in listed sequence on a p-type silicon substrate 2 serving as a semiconductor substrate. The surface layer of silicon substrate 2 has source/drain regions 2a formed at both Y-directional sides of gate electrode MG taking the above described laminated structure. Though not shown, a wells are formed on the surface layer of silicon substrate 2.

Silicon oxide film 3 is formed by thermal oxidation and serves as a gate insulating film or a tunnel insulating film. Floating gate electrode FG serving as a first conductive layer is configured by a polycrystalline silicon layer 4a doped with impurities such as phosphorous. ONO film 5 is formed so as to cover the upper surface of polycrystalline silicon layer 4a. ONO film 5 functions as an inter-gate insulating film between control gate electrode CG and floating gate electrode FG as well as an inter-poly insulating film between polycrystalline silicon layers 4 and 6. Radical nitridation process may be performed prior to and after forming ONO film 5 to obtain a NONON configuration (silicon nitride film-silicon oxide film-silicon nitride film-silicon oxide film-silicon nitride film) comprising laminated layers of silicon oxide films and silicon nitride films.

Control gate electrode CG comprises a polycrystalline silicon layer 7 doped with impurities such as phosphorous and a cobalt silicide layer 8 formed on polycrystalline silicon layer 7. Select gate electrode SG of select gate transistor Trs1 and stacked gate electrode MG of memory transistor Trm are substantially identical in structure. Polycrystalline silicon layer of gate electrode SG is identified by reference symbol 4b instead of "4a" of its counterpart of gate electrode MG for comparative understanding.

Gate electrode SG establishes structural and electrical connections with polycrystalline silicon layer 4b of the lower-layer gate electrode (second conductive layer) and polycrystalline silicon layer 6b of the upper-layer gate electrode (conductive layer) via through hole 5a defined on inter-gate insulating film 5. Polycrystalline silicon layers 4a and 4b are formed on the same gate insulating film 3, for example, in the same step.

Referring to FIGS. 2 and 3A, select gate electrodes SG of select gate transistor Trs1 are arranged in Y-directional alignment with gate electrodes MG of memory cell transistors Trm. Neighboring gate electrodes MG of memory cell transistors Trm are spaced apart from one another in the Y-direction by a first width P1 (corresponding to 2F) when measured from the centers of gate electrodes MG. A pair of select gate electrodes SG formed in Y-direction alignment is disposed at each side of a region intervening block B1 and block B2. The neighboring select gate electrodes SG are spaced apart from one another in the Y-direction by a second width P2 (corresponding to 8F) greater than first width P1 when measured from the centers select gate electrodes SG.

As described earlier, the ratio of the Y-directional gate length (width) of select gate electrode SG to gate electrode MG are configured at approximately 3 to 1. Silicon substrate 2 has formed in its surface layer, intervening gate electrodes MG and intervening gate electrodes MG and SG, impurity diffusion layers 2a constituting the source/drain regions. Impurity diffusion layers 2a are also formed in the surface layer of silicon substrate 2 residing between gate electrodes SG so as to be situated at both sides of gate electrode SG.

Bit line contact CB is configured at the middle of the pair of gate electrodes SG. On the surface layer of silicon substrate 2 directly below the bit line contact CB, an impurity diffusion layer 2b is formed that is of the same conductive type but with greater impurity concentration compared to impurity diffusion layer 2a. Bit line contact CB will be detailed afterwards.

Along the sidewalls of gate electrodes MG and gate electrodes SG is formed silicon oxide films 9. Gaps between silicon oxide films 9 on the sidewalls of gate electrode MG and silicon oxide film 9 on the sidewalls of select gate electrode SG, and gaps between opposing silicon oxide films 9 of sidewalls of neighboring gate electrodes MG are filled with a silicon oxide film 10. Silicon oxide film 10 is formed by LP-CVD (Low Pressure Chemical Vapor Deposition).

On the sidewall of silicon oxide film 9 between the pair of gate electrodes SG is formed a spacer 10a made by processing silicon oxide film 10. Silicon oxide film 10 and spacer 10a are formed on silicon substrate 2 via silicon oxide film 3. Silicon oxide film 9 is formed on inner sidewalls of opposing pair of spacers 10a.

The region interposing the pair of opposing silicon oxide films 9 situated between the pair of gate electrodes SG has silicon oxide film 3 removed from the upper surface of silicon substrate 2, and this area, without silicon oxide film 3 is placed in contact with polycrystalline silicon layer 4c.

Referring again to FIG. 2, the Y-directional spacing between the pair of select gate lines SGL1 is configured at greater width 5F compared to widths F of word line WL width, inter-word line width, and width 3F of select gate line SGL1 width. Supposing that an opening is to be created within region 5F, an SRAF (Sub Resolution Assist Features) pattern would need to be formed on the mask (reticle) due to constraints in the lithographic process.

Thus, in the present exemplary embodiment, a polycrystalline silicon layer 4c in the form of a polyplug serving as a third conductive layer is formed between the pair of select gate lines SGL in a width of 3F. The formation of the polyplug in the above described region provides structural periodicity to the possible extent and enhances lithography process margin during manufacture.

Referring to FIG. 2, polycrystalline silicon layer 4c is formed on active area Sa situated substantially in the middle between select gate electrodes SG and is formed as a Y-directionally elongate rectangle in plan view. Polycrystalline silicon layer 4c, as will be described in detail afterwards, is formed in the step of forming polycrystalline silicon layers 4a and 4b, meaning that thickness of polycrystalline silicon layers 4a, 4b and 4c are the same. The upper surface height at both lateral ends of polycrystalline silicon layer 4c is greater than the upper surface height at its mid portion because of the elevation provided by silicon oxide film 3 located at both lower side-ends of polycrystalline silicon layer 4c.

Referring again to FIG. 3, formed on polycrystalline silicon layer 4c via a barrier metal film 11 is a metal layer 12. Barrier metal film 11 and metal layer 12 constitute a metal plug and is formed as a Y-directionally elongate ellipse in plan view as shown in FIG. 2. The metal plug (barrier metal film 11 and metal layer 12) is an elliptical column in three-dimension. As shown in FIGS. 2 and 3A, the upper surface of the polyplug (polycrystalline silicon layer 4c) is formed to occupy greater area than the bottom surface of metal plug (barrier metal film 11 and metal layer 12), and the metal plug contacts the upper surface of polycrystalline silicon layer 4c.

Polycrystalline silicon layer 4c and the metal plug constitute bit line contact CB (contact plug). Bit line contact CB electrically connects bit lines BL (not shown in FIG. 3A) of the upper layer and diffusion layer 2b of the surface layer of silicon substrate 2.

ONO film 5 is formed between the pair of gate electrodes SG in regions where barrier metal film 11 and metal layers 12 are not formed on polycrystalline silicon layer 4c. On ONO film 5 formed in the above described region, silicon oxide film 14 is formed along the upper portion of the silicon oxide film 9 sidewall to serve as an insulating film.

Along the upper inner surface of silicon oxide film 14, a silicon nitride film 13 is formed as insulating film. Silicon nitride film 13 is used for self aligning formation of a through hole for bit line contact CB penetrating through polycrystalline silicon layer 4c and reaching down to the upper surface of polycrystalline silicon layer 4c. Films 5, 13, and 14 beside bit line contact CB may be removed, if required.

Within memory cell region M, silicon oxide film 15 is formed as an insulating film so as to cover the upper surface of the gate electrode MG, and on the upper surfaces of silicon oxide films 9 and 10 situated between gate electrodes MG, and between gate electrodes MG and SG. Silicon oxide film 15 is formed partially about the outer periphery of bit line contact CB.

Above silicon oxide film 15, a silicon nitride film 16 is formed which further has a silicon oxide film 17 comprising d-TEOS (Tetra Ethoxy Silane) film formed on it. Of note is that d-TEOS is a silicon oxide film formed by Dual Frequency Plasma CVD using TEOS gas. Films 16 and 17 are formed partially about outer periphery of bit line contact CB.

Silicon nitride film 16 serves as a barrier film for preventing ion or moisture diffusion, for example, within silicon oxide film 17. Silicon oxide film 15 is formed between silicon oxide film 16 and the region above gate electrodes MG and above neighboring gate electrodes MG and SG, thereby cutting down on combined capacitance between neighboring gate electrodes MG and neighboring gate electrodes MG and SG.

Figure 3B:
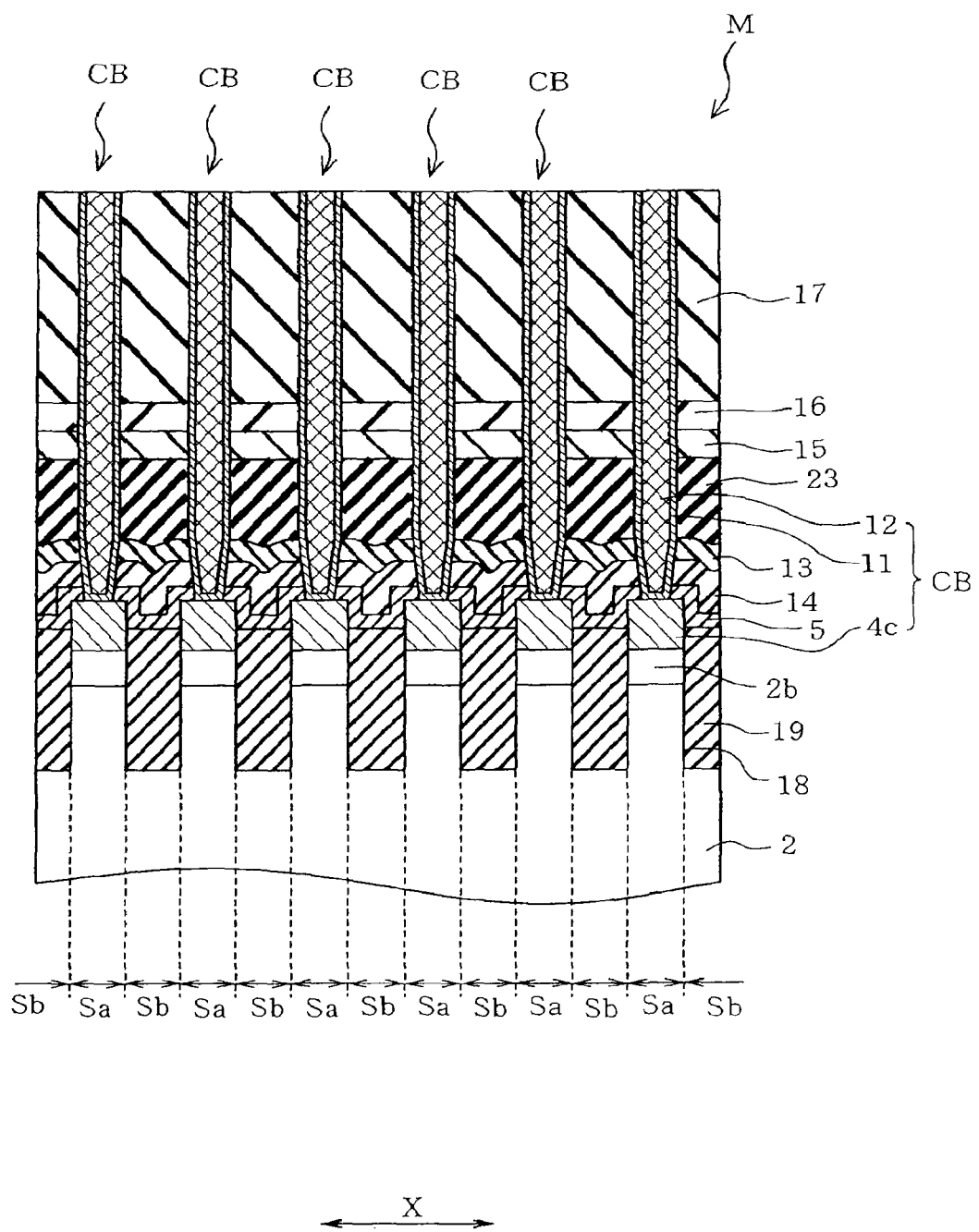
FIG. 3B is a schematic vertical cross-sectional of a bit line contact illustrated in FIG. 2, taken along line 3B-3B in FIG. 2.
Figure 3C:
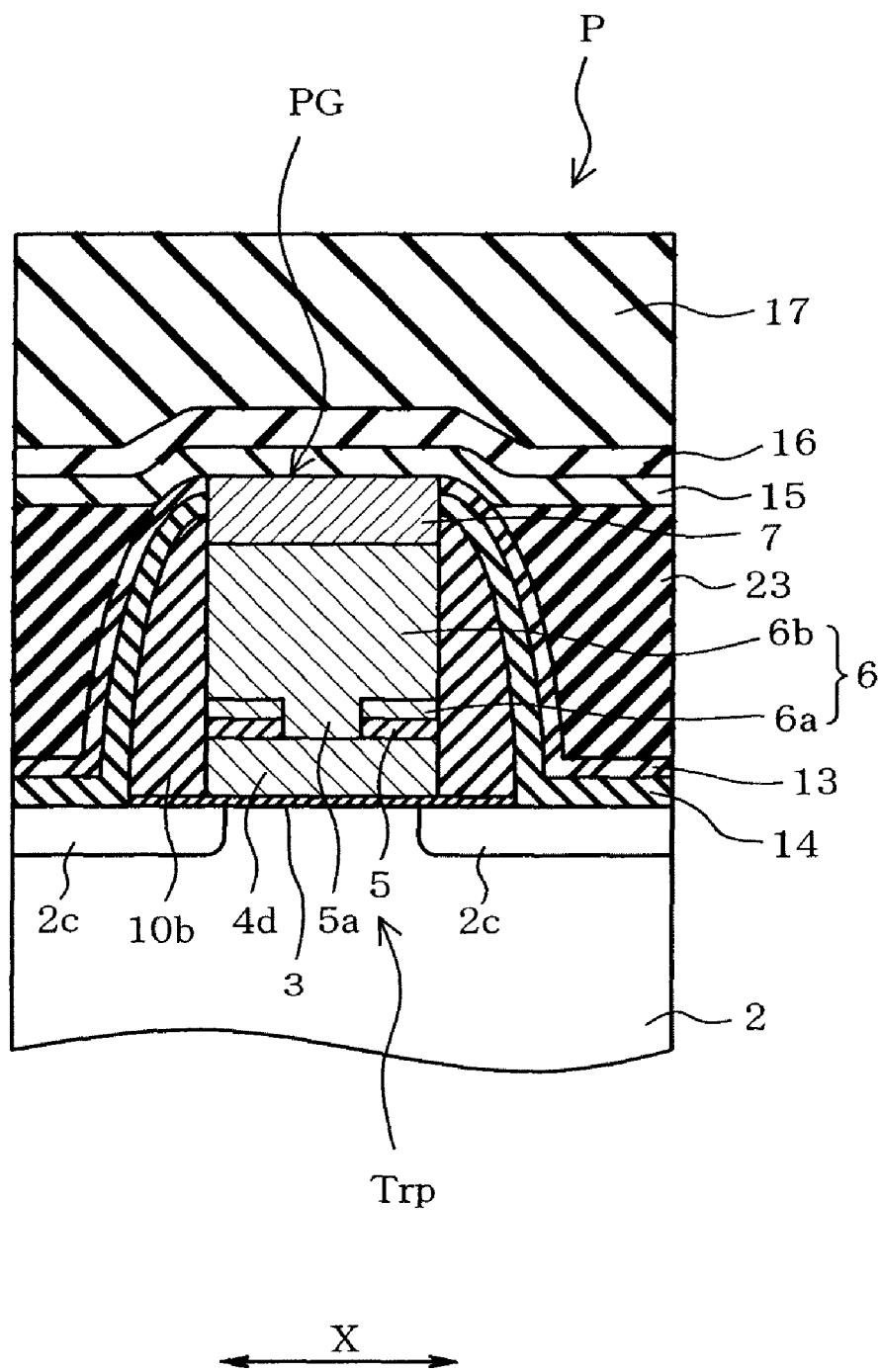
FIG. 3C is a vertical cross-sectional view schematically describing a structure of a transistor formed within a peripheral circuit region.

FIG. 3B is a schematic cross section taken along line 3B-3B of FIG. 2. As shown in FIG. 3B, an element isolation trench 18 is formed on the surface layer of silicon substrate 2. Element isolation trench 18 separates active area Sa in the X-direction. Element isolation trench 18 is filled with element isolation insulating film 19 to constitute an element isolation region Sb. Element isolation insulating film 19 comprises a silicon oxide film, for example, and is formed so as to upwardly protrude from the upper surface of silicon substrate 2.

Within active area Sa of silicon substrate 2 situated between a plurality of X-directionally neighboring element isolation insulating films 18, impurity diffusion layer 2b is formed as a contact region. Polycrystalline silicon layer 4c doped with impurities such as phosphorous is formed on each active area Sa. The upper surface of polycrystalline silicon layer 4c has higher elevation compared to the upper surface of the neighboring element isolation films 19.

ONO film 5 is formed so as to cover the upper side and side surfaces of polycrystalline silicon layer 4c and the upper surface of element isolation film 19. ONO film 5 is removed at the central region of polycrystalline silicon layer 4c upper surface, which central region has an upwardly elongate metal layer 12 formed on it via barrier metal film 11. In the surroundings of bit line contact CB, insulating films 14, 13, 23, 15, 16, and 17 are formed on ONO film 5.

FIG. 3C illustrates one example of MOS transistor configuration within peripheral circuit region P. In peripheral circuit region P, a gate electrode PG is formed on silicon substrate 2 via silicon oxide film 3. Since gate electrode PG is similar in structure to select gate electrode SG, thus will not be described in detail.

Along the sidewall surface of gate electrode PG is formed a spacer 10b being formed by processing silicon oxide film 10. Silicon oxide film 14 is formed on silicon substrate 2 and further extends over along the outer surface of spacer 10b to terminate in contact with side surface of gate electrode PG. Further, silicon oxide film 14 has silicon nitride film 13 formed along its outer surface.

Silicon nitride film 13 serves as a barrier film to restrain passage of moisture and impurities for example. Spacer 10b may be removed to allow silicon oxide film 14 and silicon nitride film 13 to be in direct contact along the sidewall surface of gate electrode PG.

Silicon nitride film 13 has a silicon oxide film 23 comprising BPSG formed on it. Over silicon oxide film 23 and cobalt silicide film 7, silicon oxide film 15, silicon nitride film 16, and silicon oxide film 17 are laminated in listed sequence.

Next, the manufacturing steps of the NAND flash memory 1 will be described with reference to FIGS. 4A to 13B. Since the manufacturing steps of memory cell region M constitutes the features of the present exemplary embodiment, the following descriptions will focus primarily on manufacturing method of memory cell region M. Though manufacturing method of peripheral circuit region P will be described as required, description will not be given on other structures of the device. Steps required for forming other regions of flash memory 1 not shown may be added as required.

First, ions are implanted into silicon substrate 2 for formation of wells and channel regions. Then, a gate insulating film (not shown) dedicated to high-voltage transistors is formed in a peripheral circuit region P. The gate insulating film (not shown) is selectively removed from a memory cell region M and portions where low-voltage transistors are formed.

Figure 4:
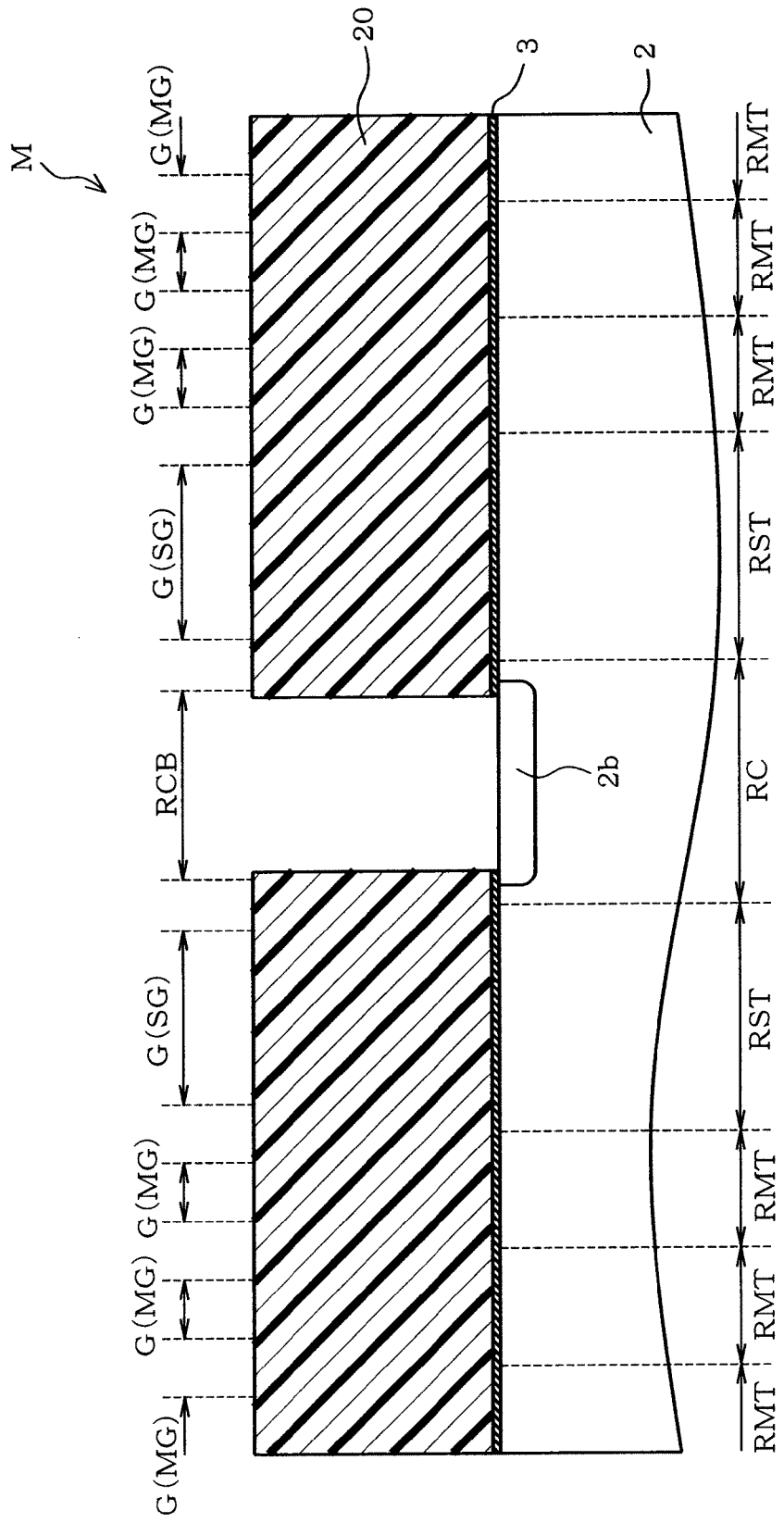
FIGS. 4, 5A, 6A, 7A, 8A, 9A, 10A, 11A, 12A, and 13A each schematically describes a vertical cross-sectional view of one out of ten manufacturing phases of the portion taken along line 3A-3A of FIG. 2.

Next, referring to FIG. 4, a gate insulating film is formed by thermally processing silicon oxide film 3 in memory cell region M comprising a memory cell transistor forming region RMT and a select gate transistor forming region RST. At this instance, silicon oxide film 3 for the low-voltage transistor in peripheral circuit region P is formed simultaneously. Of note is that gate insulating film for the high-voltage transistor in peripheral circuit region P is formed in greater thickness then its counterpart in memory cell region M.

Next, a mask pattern 20 is formed on silicon oxide film 3 overlying memory cell transistor forming region RMT and select gate transistor forming region RST and n-type impurity ions are implanted on the surface layer of silicon substrate 2 for forming diffusion layer 2b. Then, using mask pattern 20, gate insulating film (gate oxide film) 3 situated on contact region RC is partially removed. Contact region RC comprises an opening in mask pattern 20 for forming bit line contact CB.

In order to minimize damaging of silicon substrate 2 when processing gate electrodes MG and SG later in the manufacturing flow, the removal of silicon oxide film 3 at this instance may preferably be performed in narrower width compared to the upper surface width (refer to spacing between upper sidewalls of polycrystalline silicon layer 4c of FIG. 3A as compared to the spacing between lower sidewalls) of polycrystalline silicon layer 4c.

Next, mask pattern 20 is removed and approximately 100 nm of polycrystalline silicon layer 4 is deposited on gate insulating film 3 of memory cell transistor forming region RMT and select gate transistor forming region RST, and on diffusion layer 2b on contact region RC. Then, silicon nitride film and a mask, being oriented in the Y-direction, are further formed (neither of which are shown) to form element isolation trench 18 on the surface layer of silicon substrate 2 as shown in FIG. 5B which is subsequently filled with element isolation film 19 so as to upwardly project from the upper surface of silicon substrate 2.

Figure 5A:
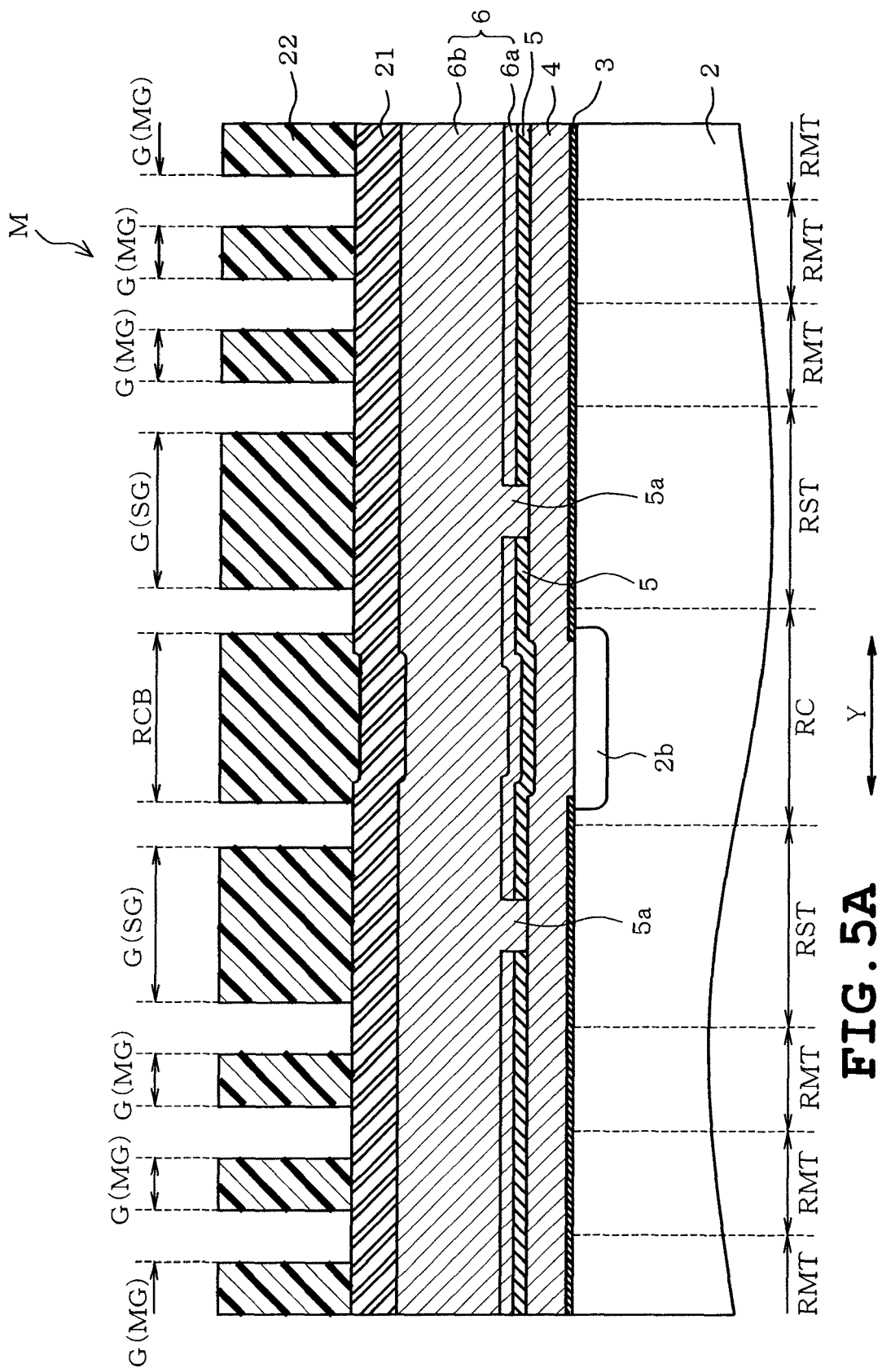
Figure 5B:
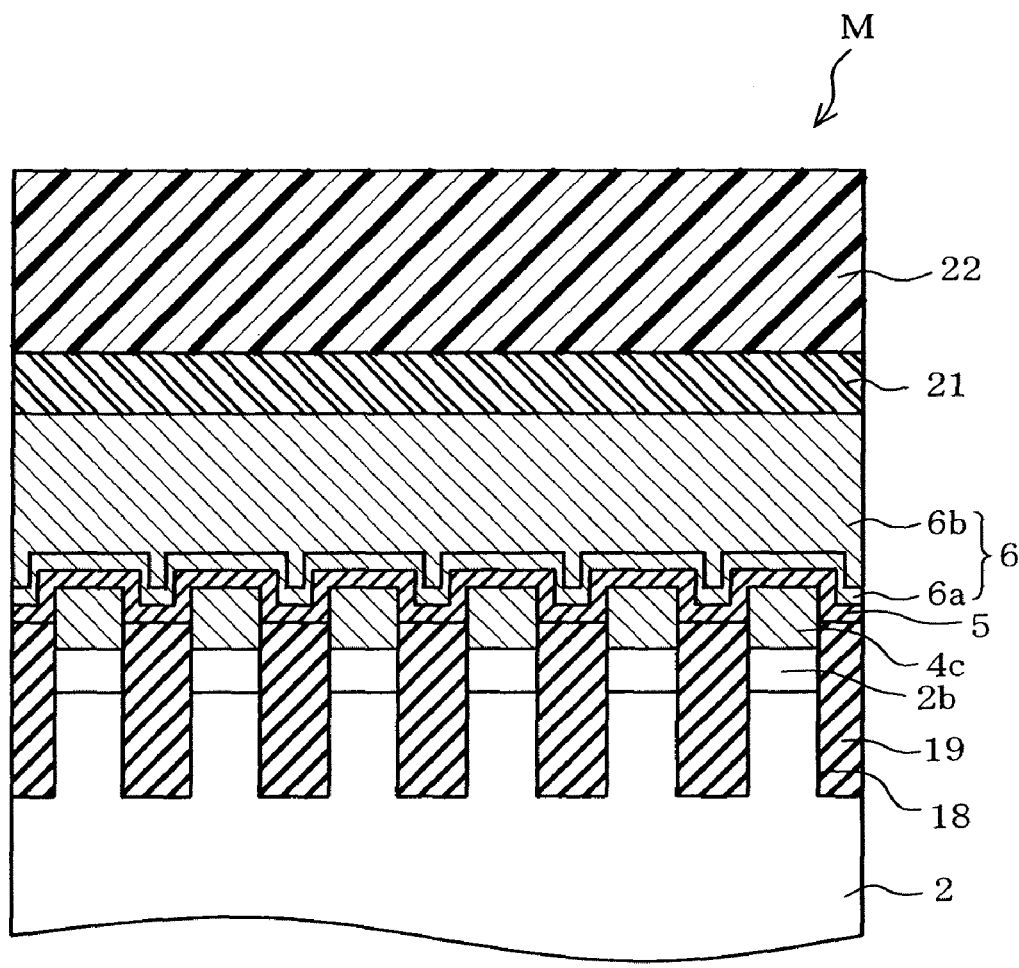
FIGS. 5B, 6B, 7B, 8B, 9B, 10B, 11B, 12B, and 13B each schematically describes a vertical cross-sectional view of one out of nine manufacturing phases of the portion taken along line 3B-3B of FIG. 2.

Next, referring to FIGS. 5A and 5B, ONO film 5 is formed by LP-CVD on polycrystalline silicon layer 4 situated on memory cell transistor forming region RMT, select gate transistor forming region RST and contact region RC. Radical nitridation process may be performed prior to and after forming ONO film 5 to obtain a NONON configuration. Next, polycrystalline silicon layers 6a and 6b are deposited in listed sequence on ONO film 5 situated above memory cell transistor forming region RMT, select gate transistor forming region RST and contact region RC. After depositing polycrystalline silicon layer 6a and before depositing polycrystalline silicon layer 6b, a step is introduced to provide an opening 5a in ONO film 5 constituting select gate electrode SG.

Since gate electrodes of high-voltage and low-voltage transistors of peripheral circuit region P and select gate electrode SG are identical in structure, opening 5a provided in select gate electrode SG is provided in transistors of peripheral circuit region P as well simultaneously.

Next, silicon nitride film 21 is formed to serve as a mask for forming gate electrodes MG and SG. Then, resist 22 is coated on the mask for patterning by lithography.

Figure 6A:
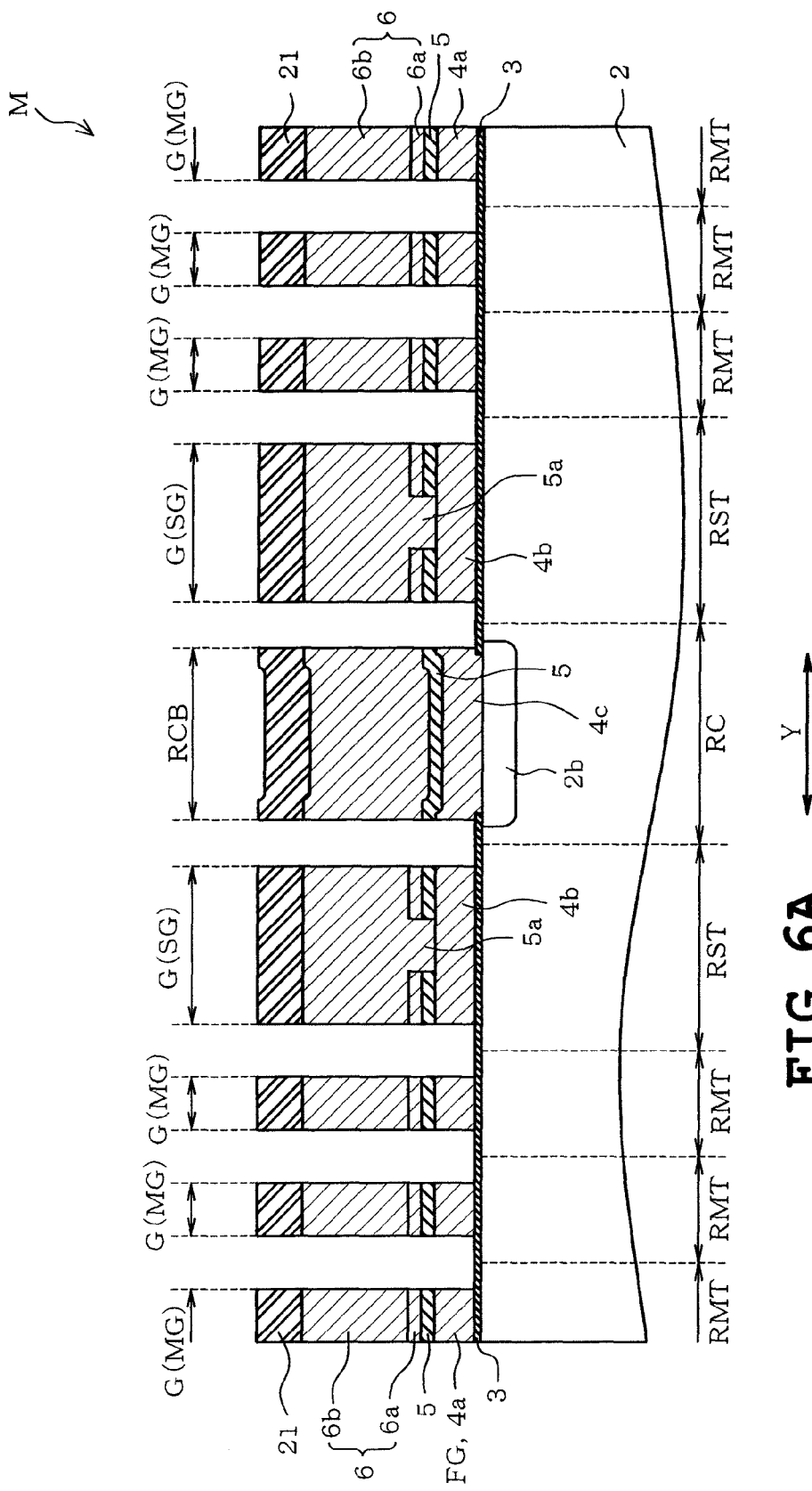
Figure 6B:
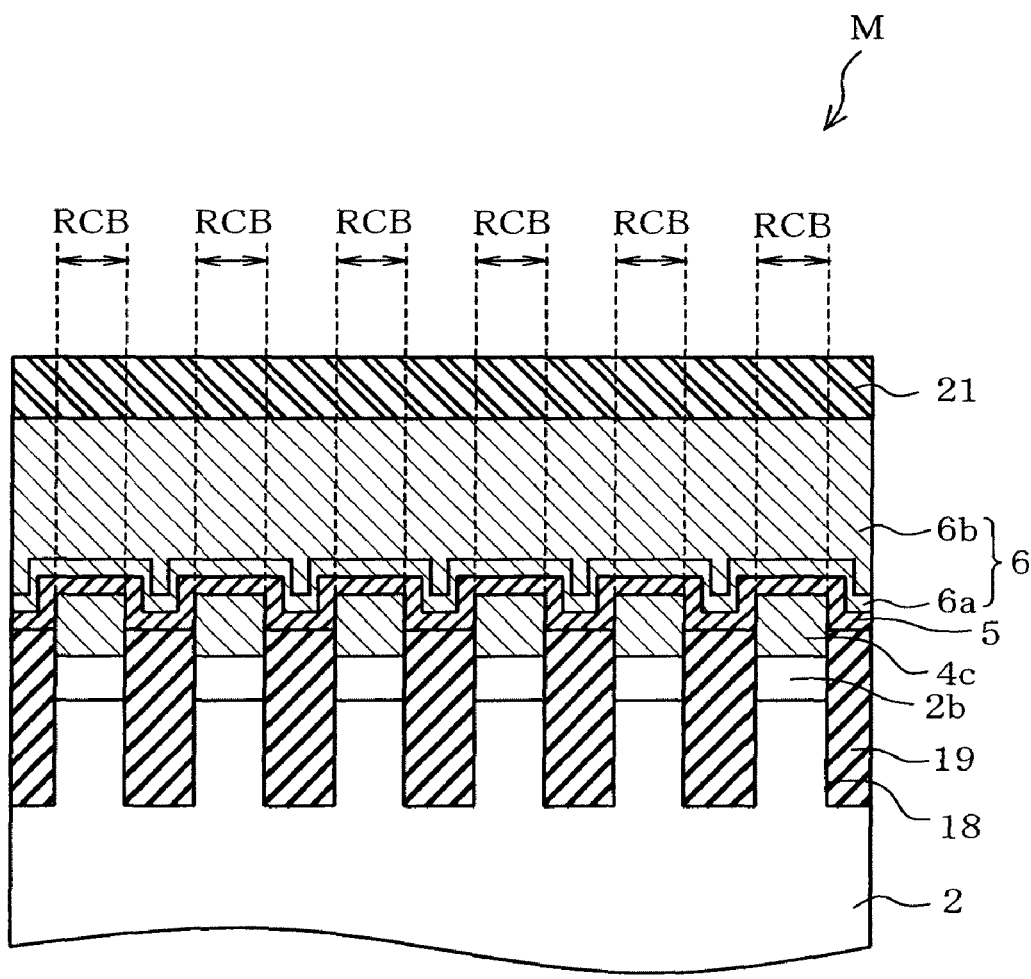

Next, referring to FIGS. 6A and 6B, using the patterned resist 22 as a mask, silicon nitride film 21, polycrystalline silicon layers 6a and 6b, and ONO film 5 situated between regions G(MG), where gate electrodes MG of memory cell transistors are formed; between regions G(MG) and regions G(SG), where gate electrodes SG of select gate transistors are formed; and between regions G(SG) and regions ROB are removed by anisotropic etching. As the result of such etching, laminated films 3, 4 (4a, 4b, 4c), 5, 6 (6a, 6b) and 21 remain on regions G(MG) and G(SG) and on regions where bit line contacts CB are formed.

Referring back to FIG. 2, where the Y-directional width of gate electrode MG is defined as F, and Y-directional width of gate electrode SG is defined as 3F, remaining polycrystalline silicon layers 4c, 6a, and 6b formed over bit line contact CB forming region situated between the pair of gate electrodes SG is located at region 3F at the substantial center between select gate lines SGL.

By forming polycrystalline silicon layers 4c, 6a, and 6b at region 3F at the substantial center between select gate lines SGL 1, Y-directional periodicity of masks used for lithography of RIE can be obtained as much as possible. Thus, increased lithography process margin can be obtained for lithography processing which allows the mask pattern of resist 22 to remain in desired periodicity. Thus, desired form patterns can be obtained for the laminated films 3, 4, 5, 6a, 6b, and 21 in the subsequent RIE.

Figure 7A:
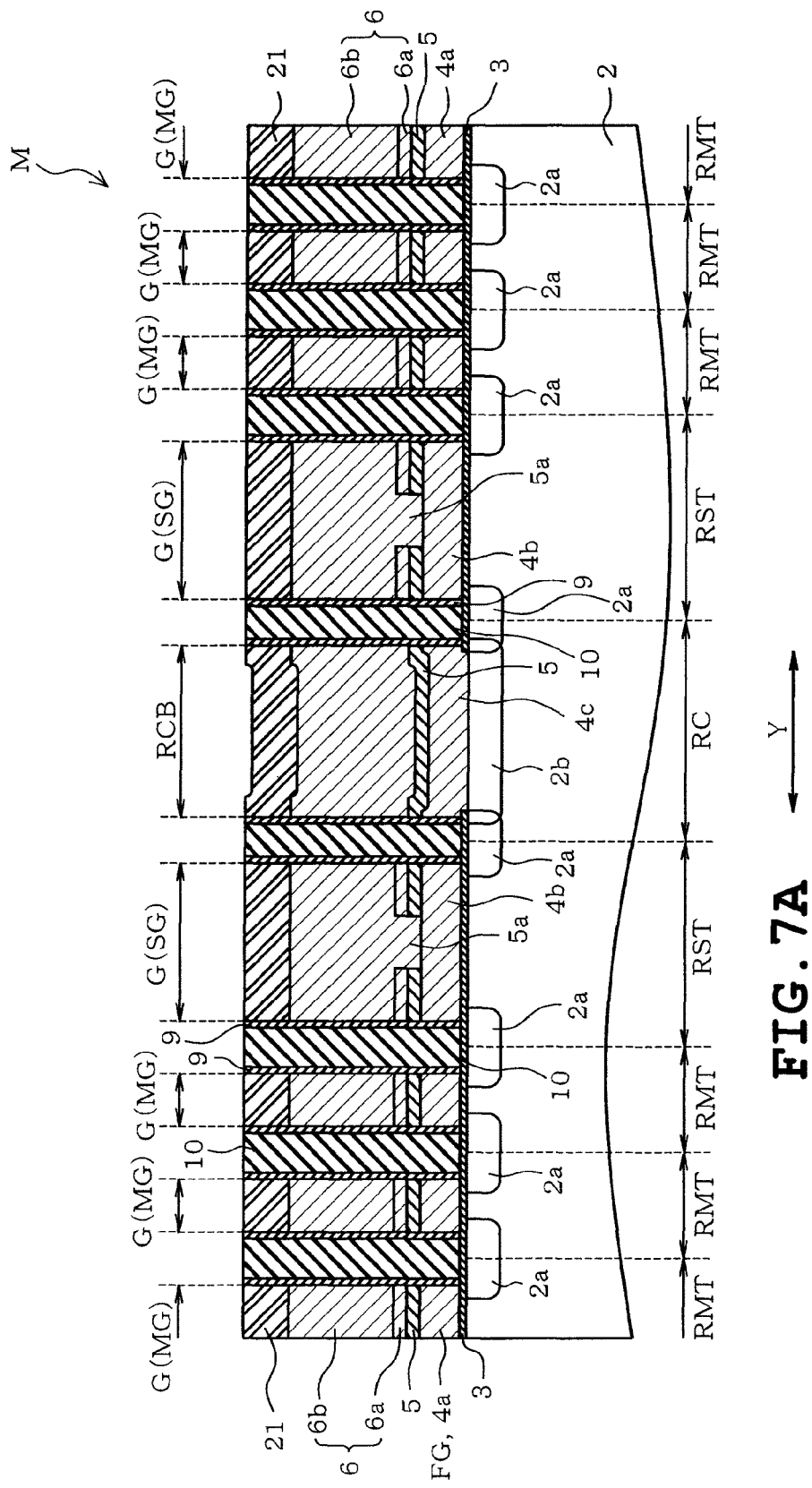
Figure 7B:
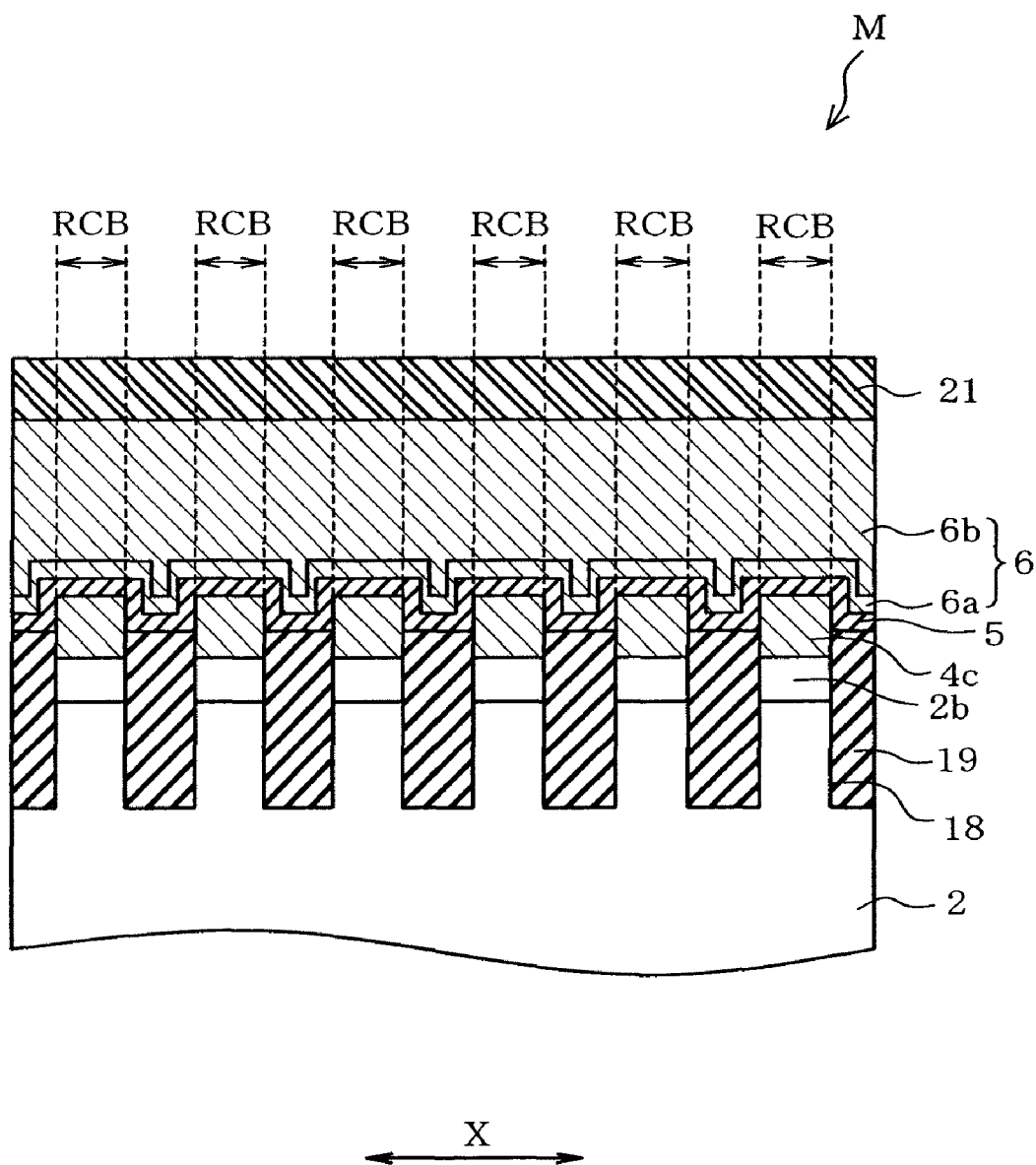

Next, referring to FIGS. 7A to 7B, silicon nitride film 9 is formed along the sidewall surfaces of laminated films 4, 5, 6a, 6b, and 21. Then, on opposing interiors of silicon oxide film 9, silicon oxide film 10 is deposited by LP-CVD using TEOS as source gas which is thereafter etched back.

Figure 8A:
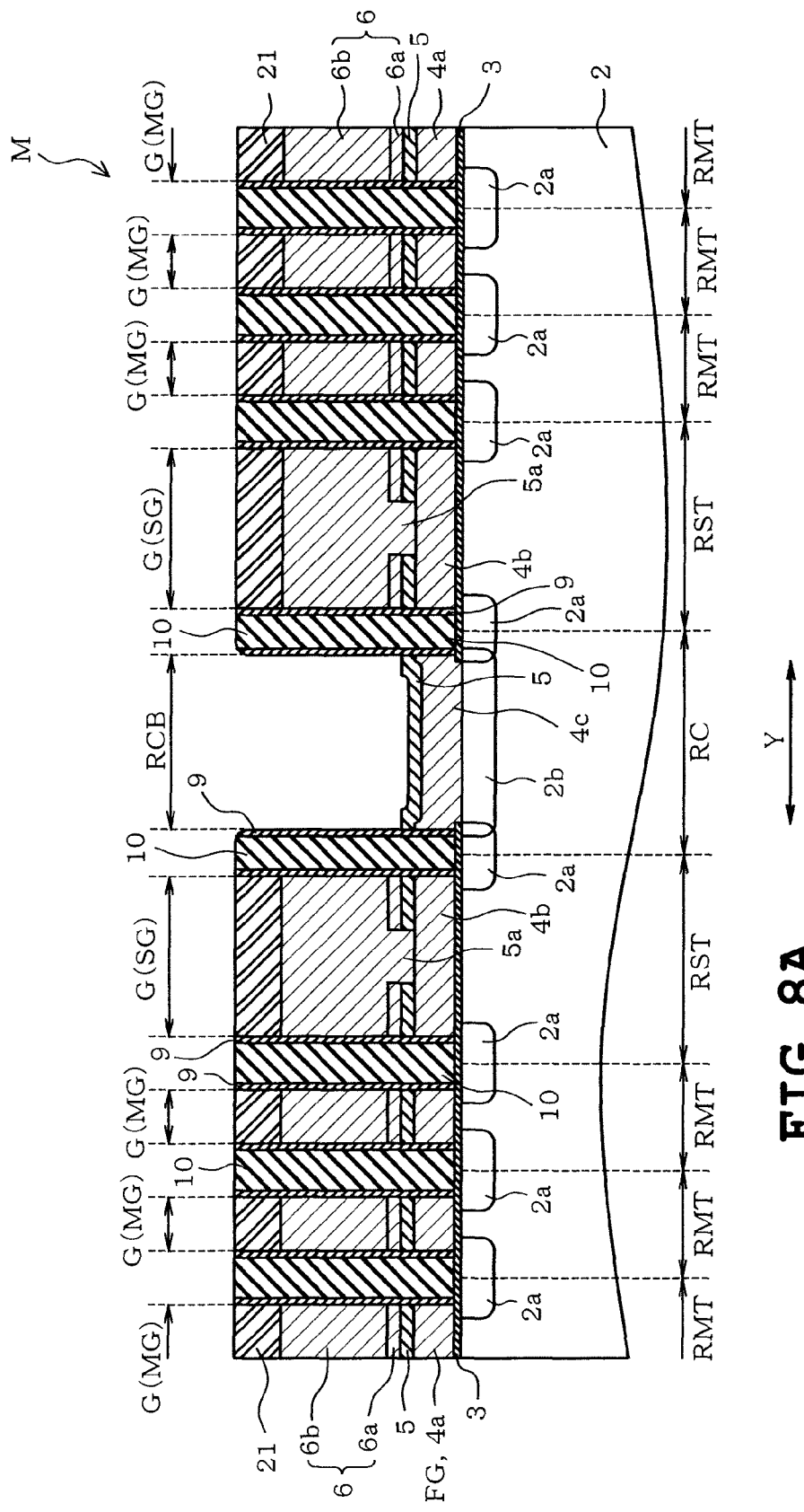
Figure 8B:
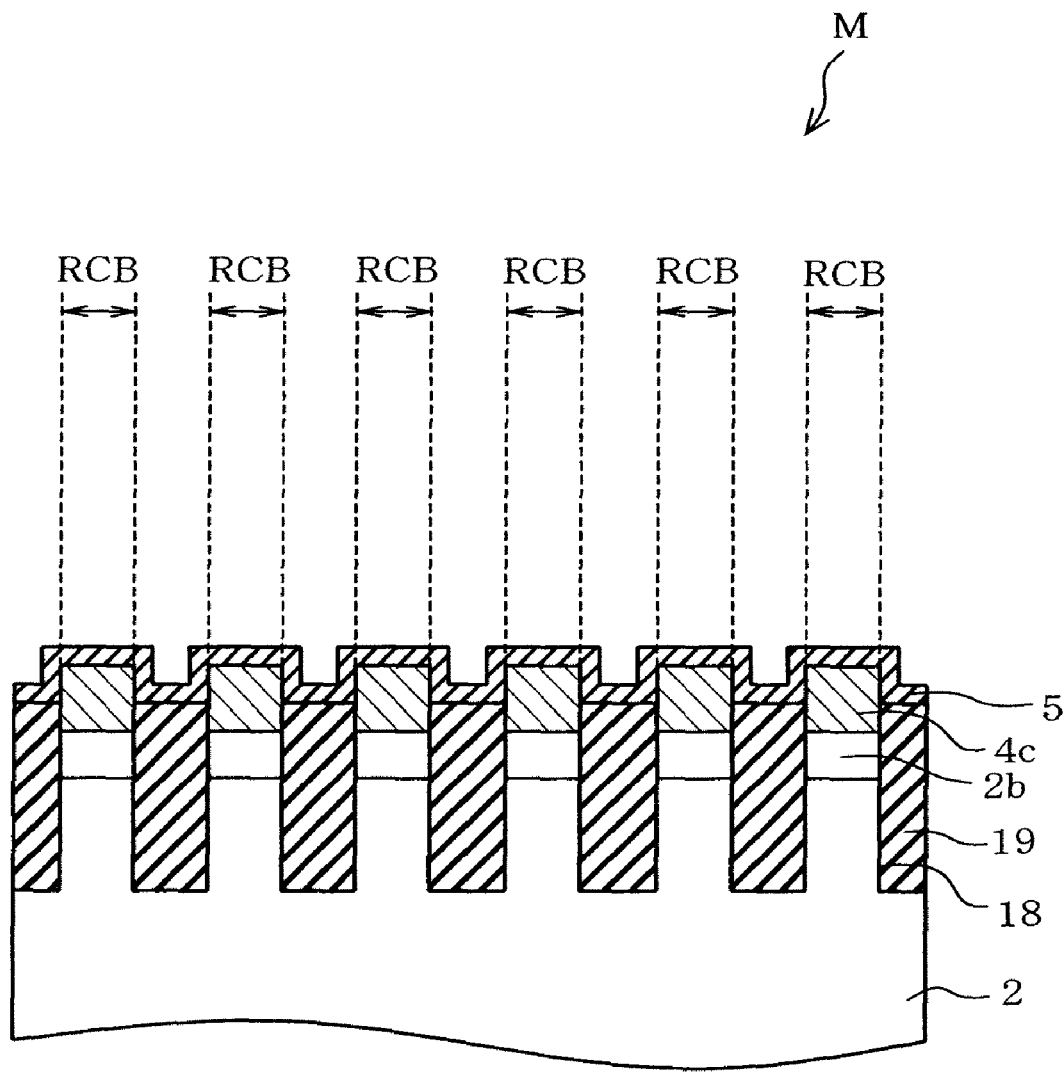

Next, referring to FIGS. 8A and 8B, a glass mask (not shown) having an opening defined in the portion corresponding to the substantial center of the region between select gate electrodes SG is formed by lithography. Then, silicon nitride film 21 and polycrystalline silicon layers 6b and 6a on ONO film 5 of the contact plug forming region RCB and its X-directional periphery are etched sequentially by RIE with selectivity to silicon oxide film.

Silicon oxide films 9 and 10, being formed so as to cover silicon oxide film 3, provides sufficient protection to silicon substrate 2 even when the etching process is performed with relatively higher selectivity to silicon oxide film 3.

Figure 9A:
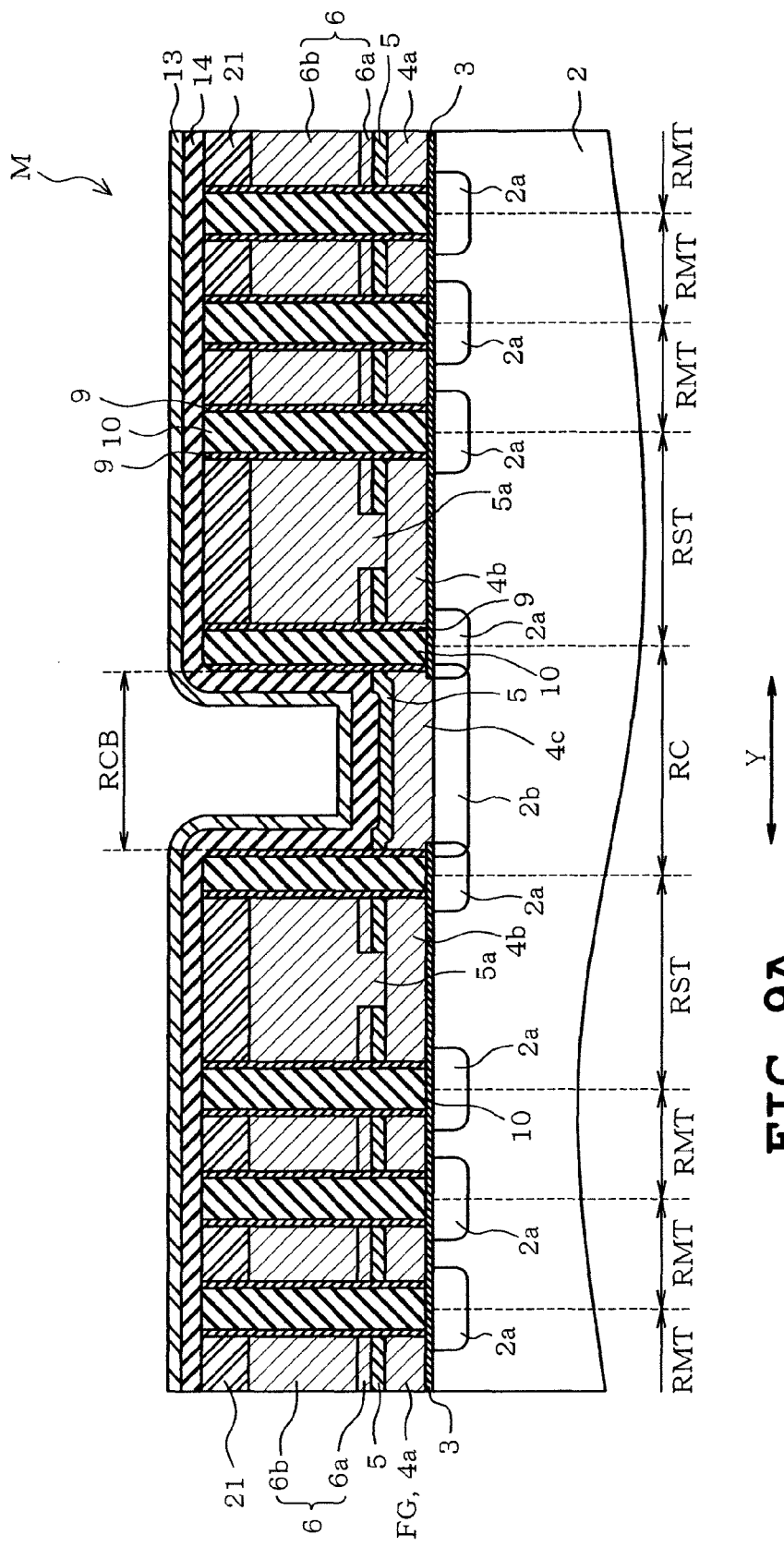
Figure 9B:
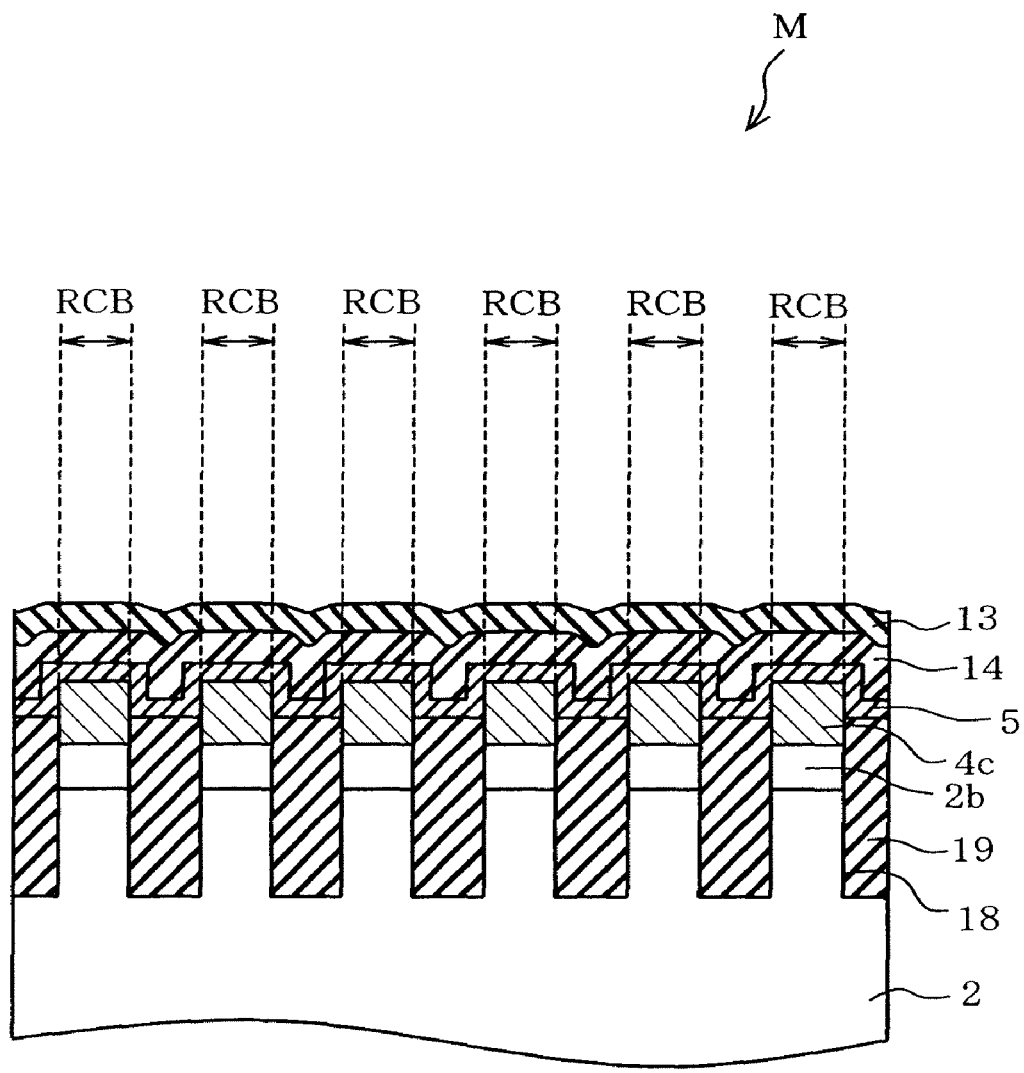

Next, referring to FIGS. 9A and 9B, silicon oxide film 14 is formed with TEOS source gas on region RMT where memory cell transistors are formed, region RST where select gate transistors are formed, and region RCB where contact plugs are formed. Then, silicon nitride film 13 is formed thereafter.

Figure 10A:
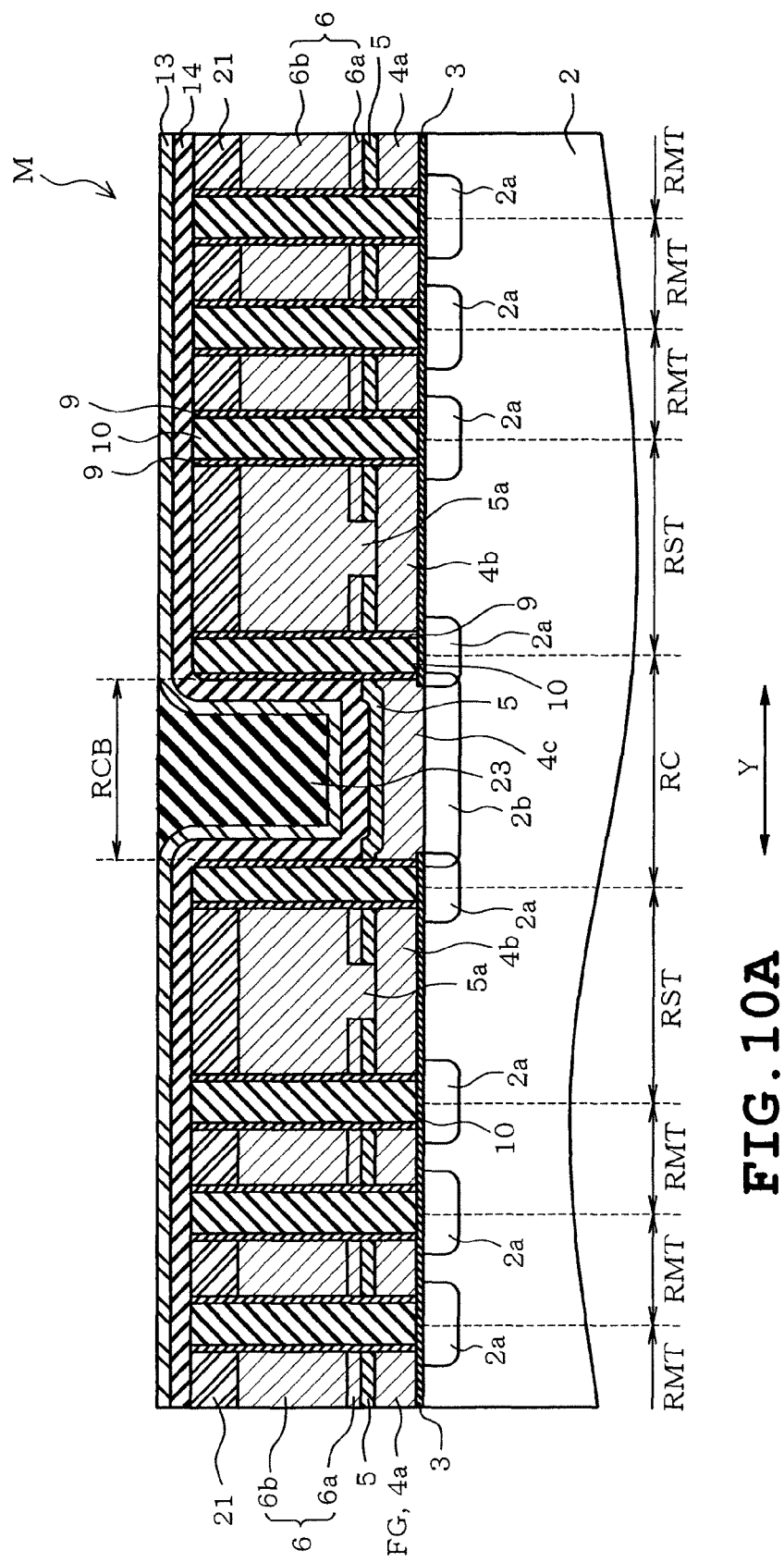
Figure 10B:
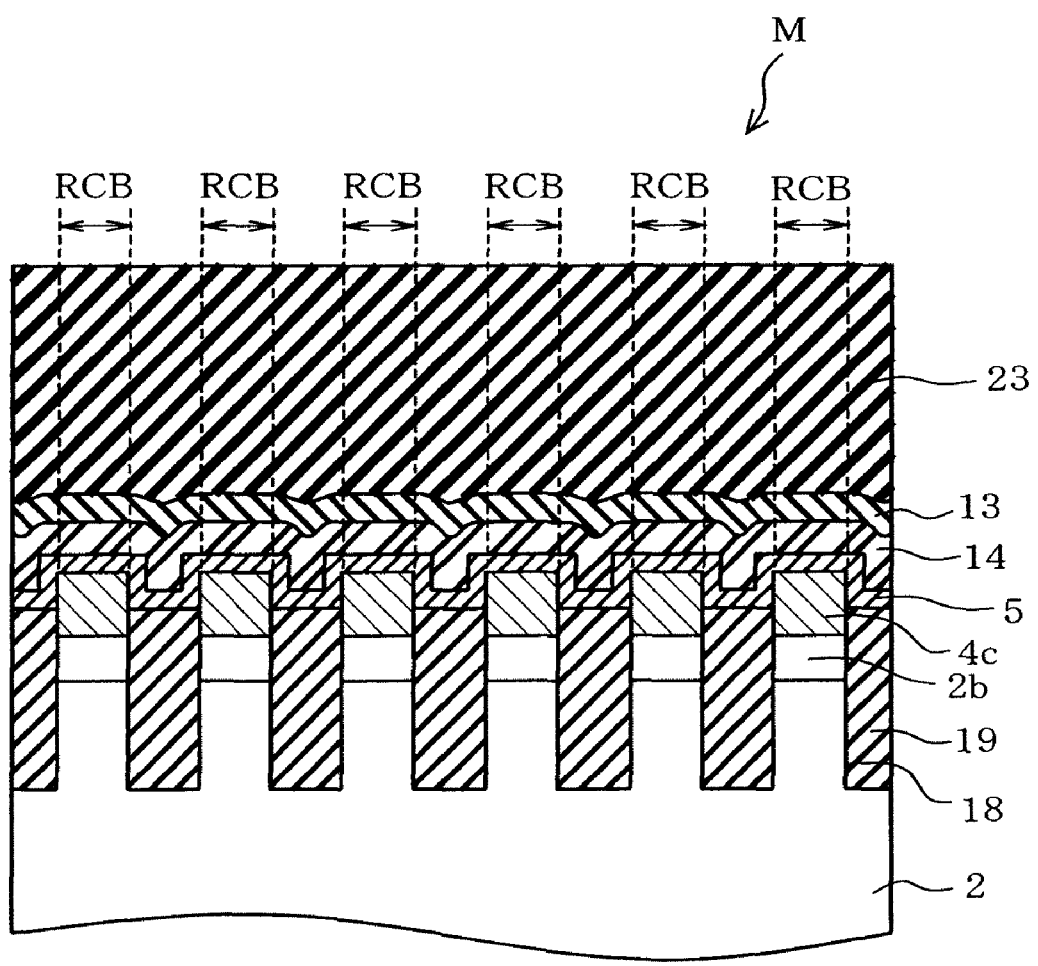
Figure 10C:
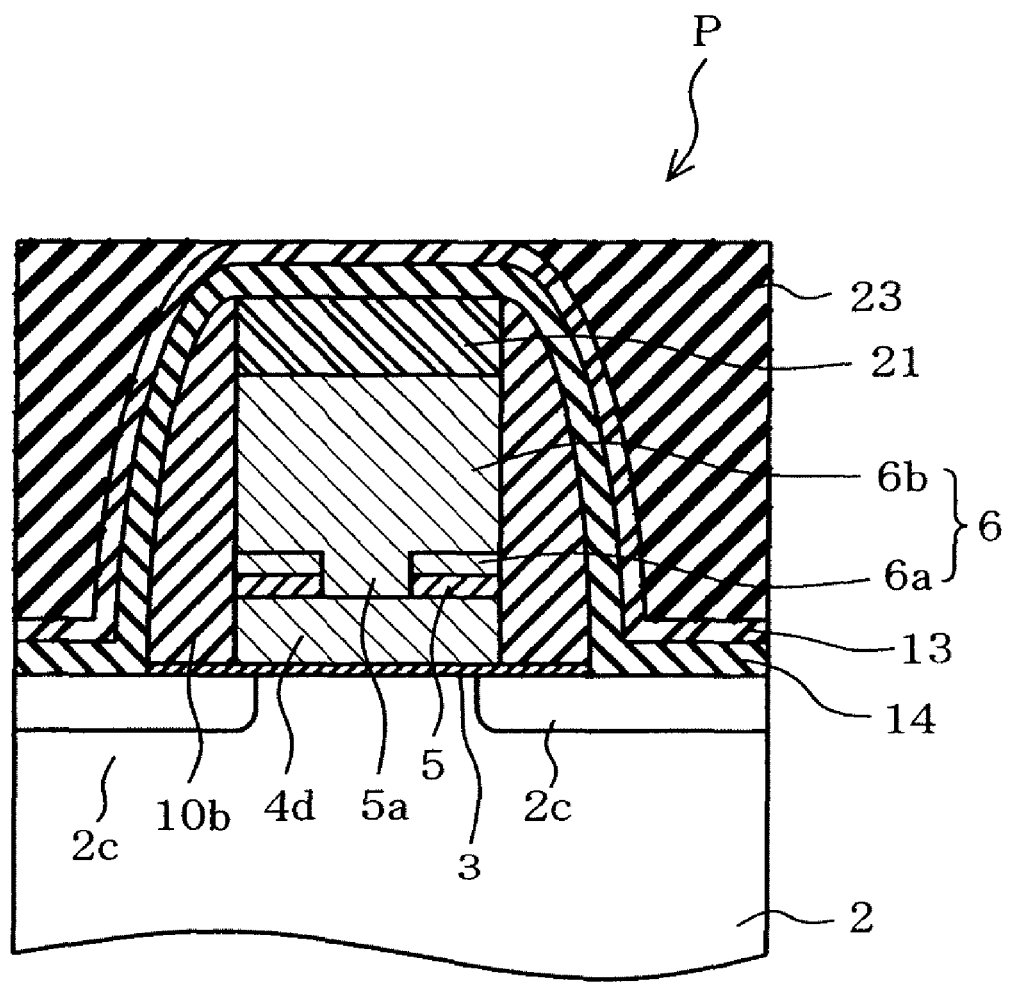
FIG. 10C is a vertical cross-sectional view schematically describing one manufacturing phase of a structure of a transistor formed within the peripheral circuit region.

Referring to FIGS. 10A and 10B, silicon oxide film 23 comprising BPSG is formed on silicon nitride film 13. Then, CMP is performed for planarization by using silicon nitride film 13 as a stopper to obtain the configuration shown in FIG. 10A where silicon oxide film 23 is filled in the inner side of silicon nitride film 13 within region RCB formed with contact plugs.

Within memory cell region M, silicon oxide film 14 and silicon nitride film 13 only serve as CMP stopper. However, in the corresponding structure at this juncture of peripheral circuit region P shown in FIG. 10C, silicon nitride film 13 may be used as a barrier film serving as a barrier to prevent permeation of unwanted elements such as impurities and moisture from silicon oxide film 23, and silicon oxide film 14 may be utilized for surface protection of silicon substrate 2.

Figure 11A:
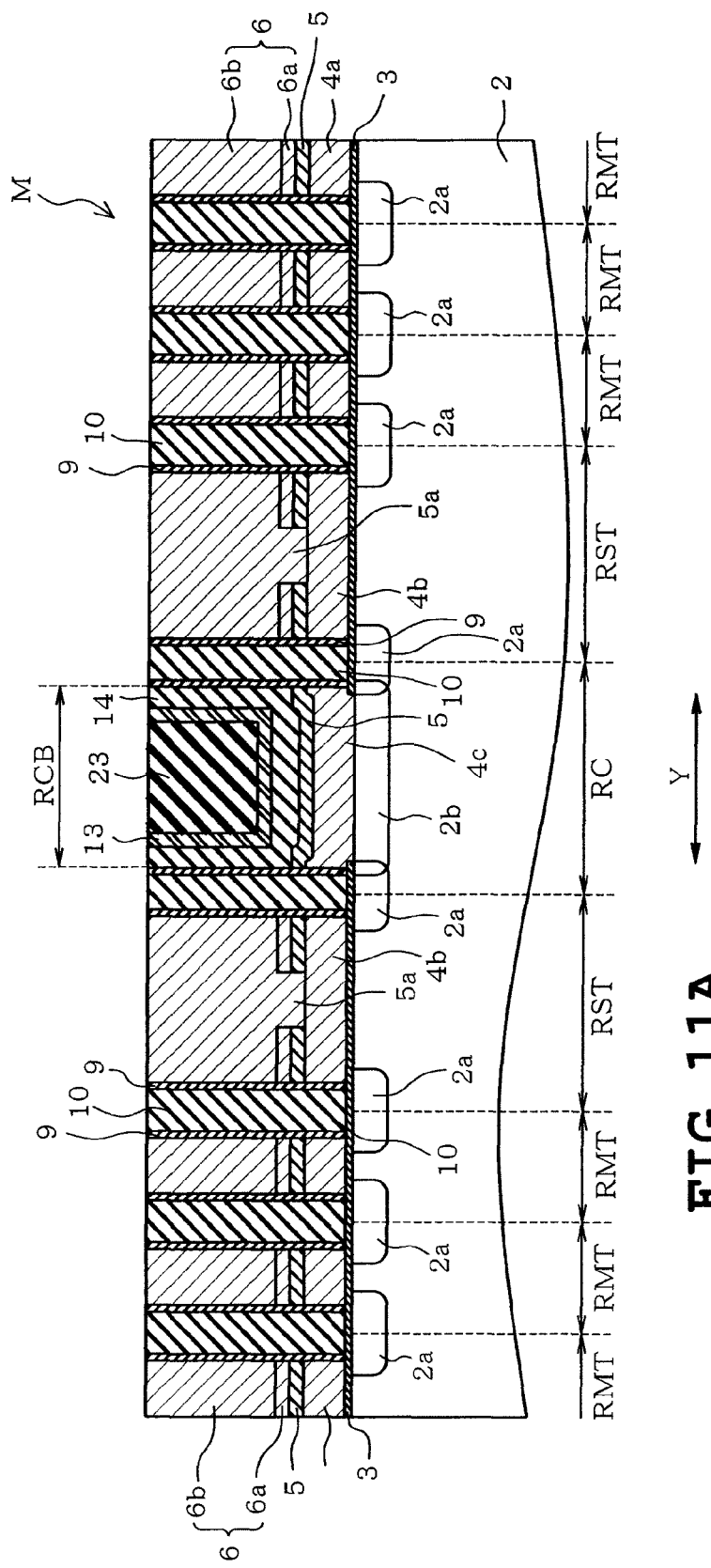
Figure 11B:
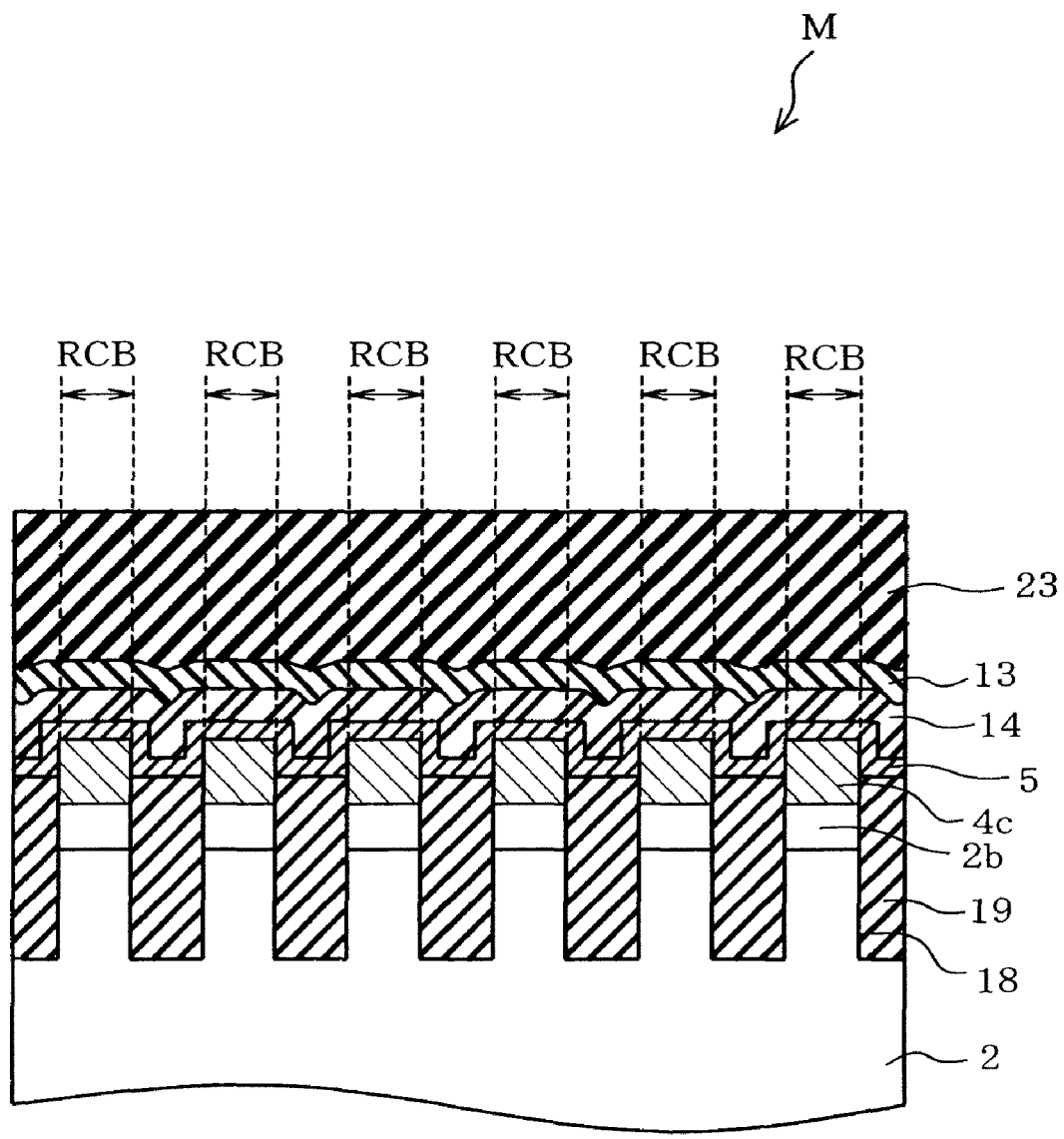

Next, referring to FIGS. 11A and 11B, silicon nitride film 21 is etched by RIE to expose the upper surface of polycrystalline silicon layer 6b.

Figure 12A:
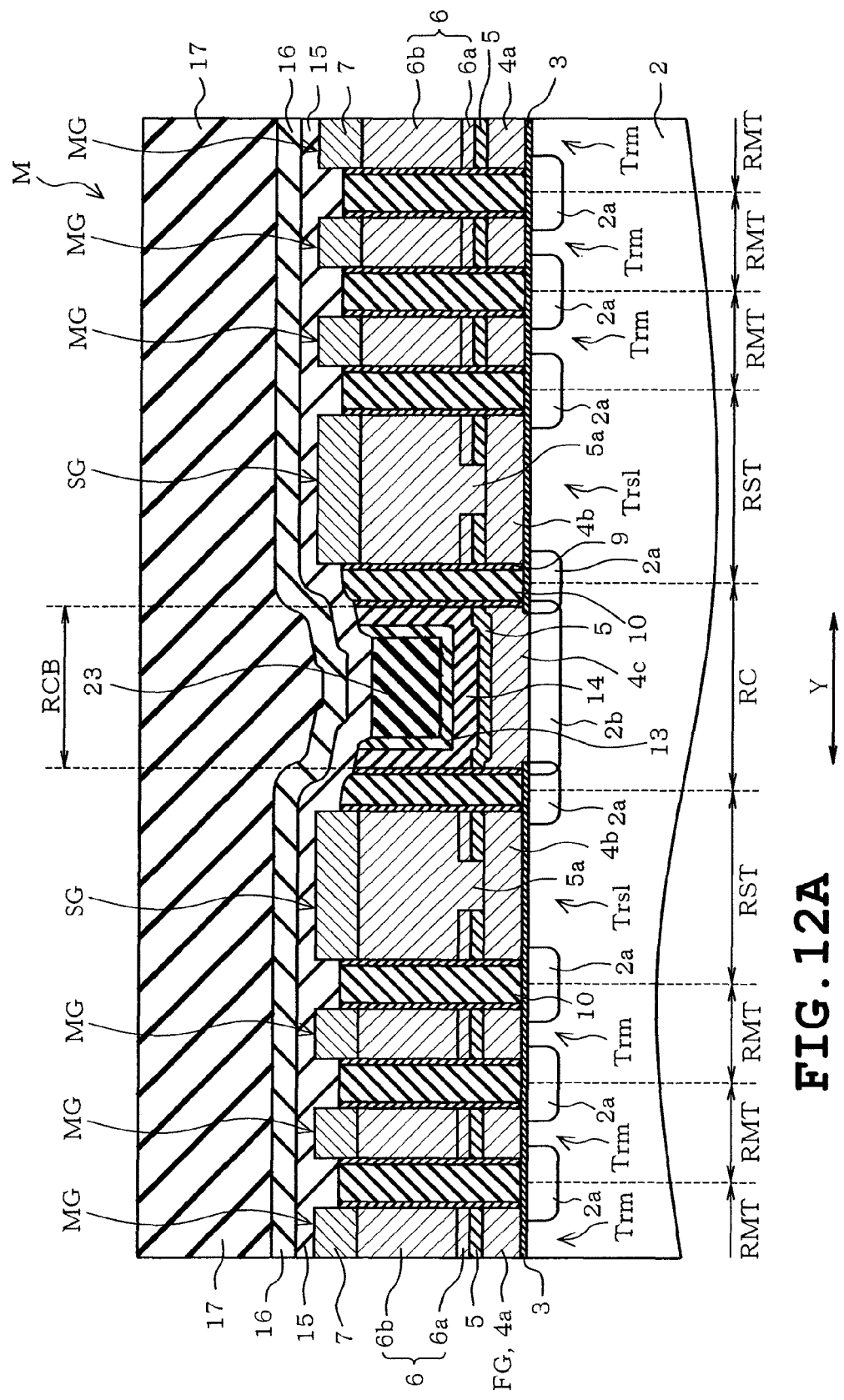
Figure 12B:
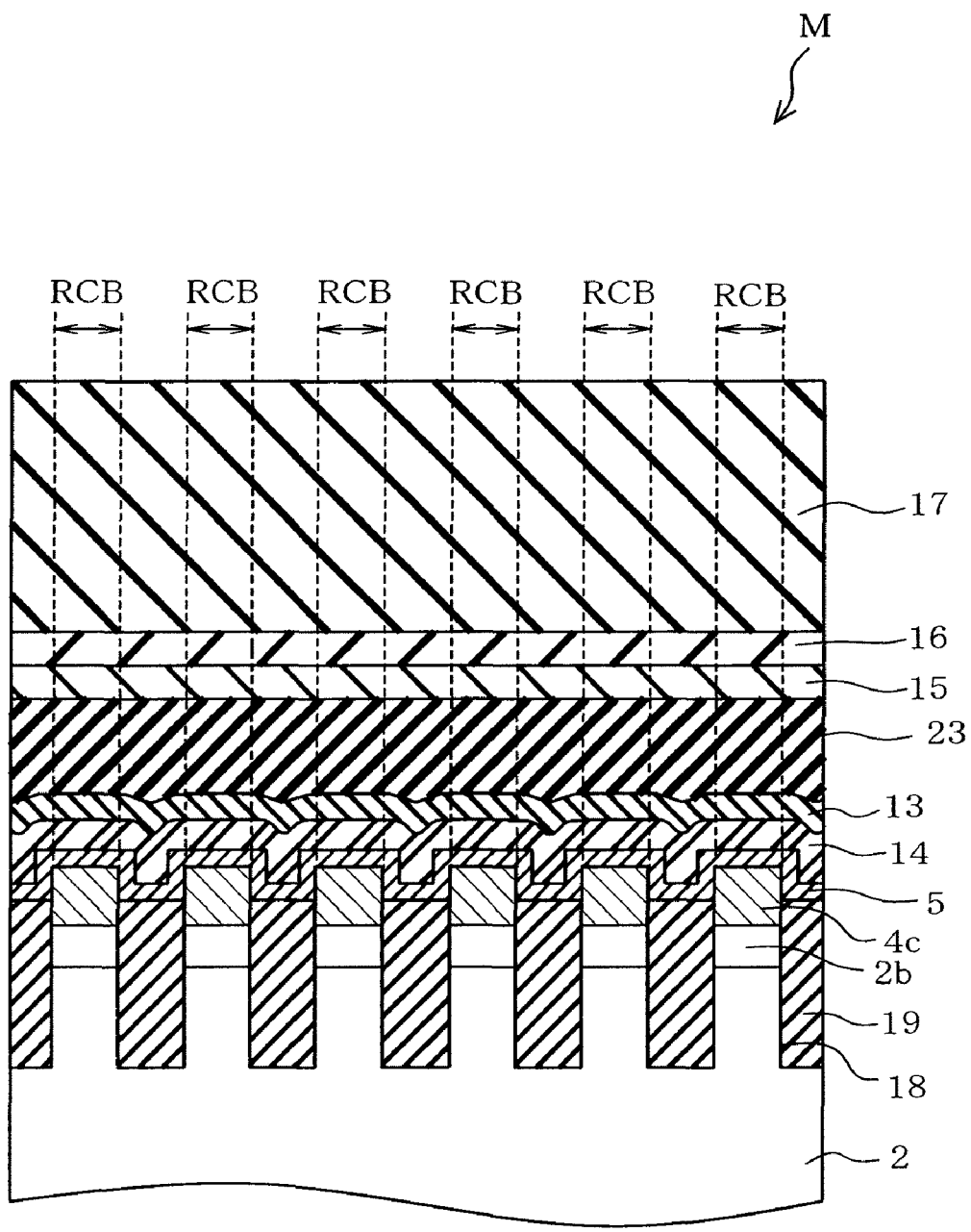

Next, referring to FIGS. 12A and 12B, the exposed surface of polycrystalline silicon layer 6b is cleaned to remove elements such as native oxide. Then, metal such as cobalt is formed by sputtering, whereafter lamp anneal and removing of non-reactive metal are repeated to form a cobalt silicide ($CoSi_2$) film 7 serving as metal silicide on polycrystalline silicon layer 6b. Subsequently, silicon oxide film 15 is formed on gate electrodes MG and SG by LP-CVD by using TEOS gas, between gate electrodes MG, between gate electrodes SG, and between gate electrodes MG and SG.

More specifically, silicon oxide film 15 is formed across the upper surface of cobalt silicide film 7, silicon oxide films 9, 10, 13, silicon nitride film 14, and silicon oxide film 23 comprising BPSG. Thus, gaps between the neighboring upper portions of cobalt silicide films 7 are filled with silicon oxide film 15 to effect reduction of parasitic capacitance between the neighboring gate electrodes MG. Subsequently, silicon nitride film 16 is formed on silicon oxide film 15 by LP-CVD. Silicon nitride film 16 being formed on cobalt silicide film 7 via silicon oxide film 15 is used for preventing contamination of cobalt silicide film 7. Then, a thick interlayer insulating film comprising silicon oxide film 17 is deposited by CVD, using d-TEOS gas.

Figure 13A:
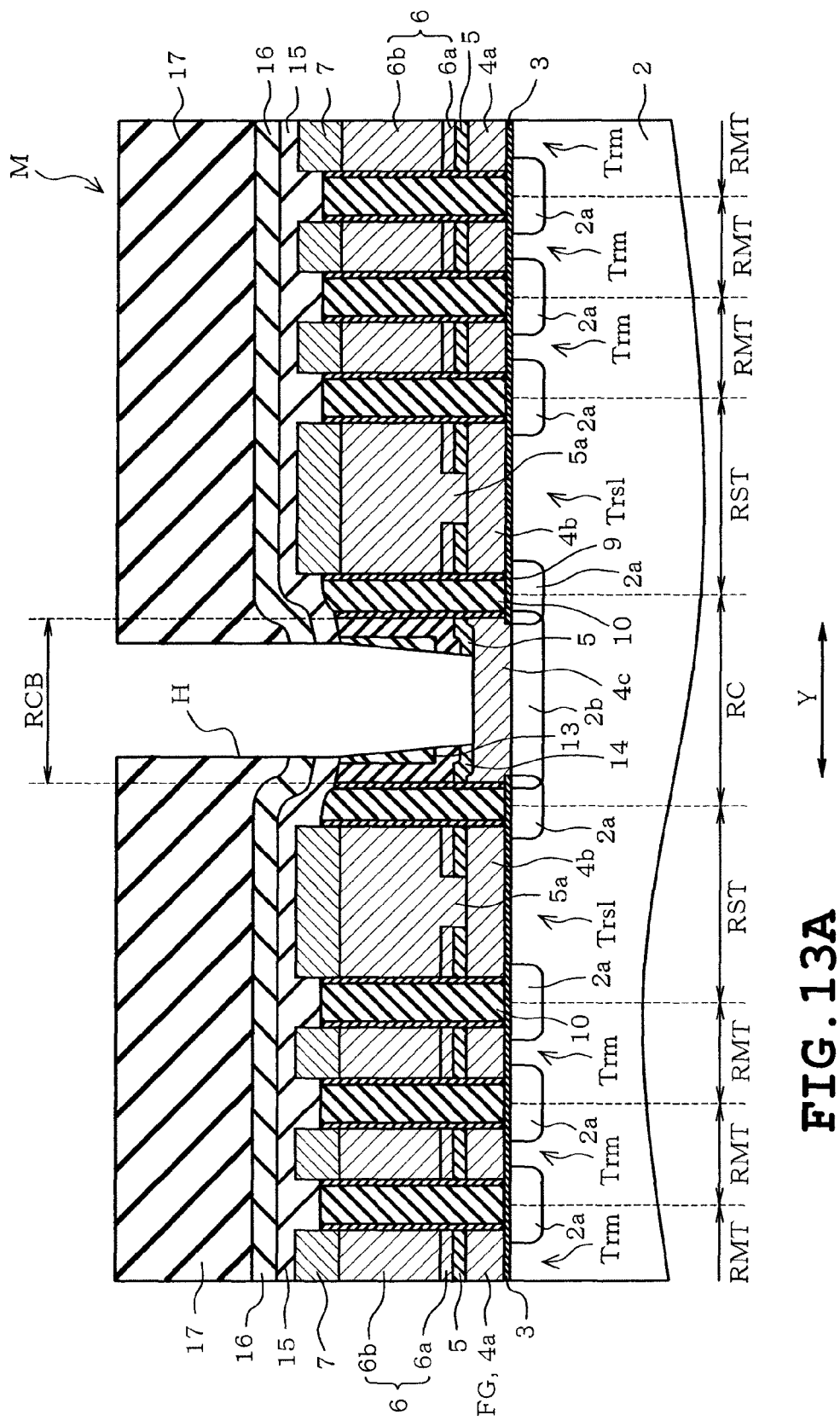
Figure 13B:
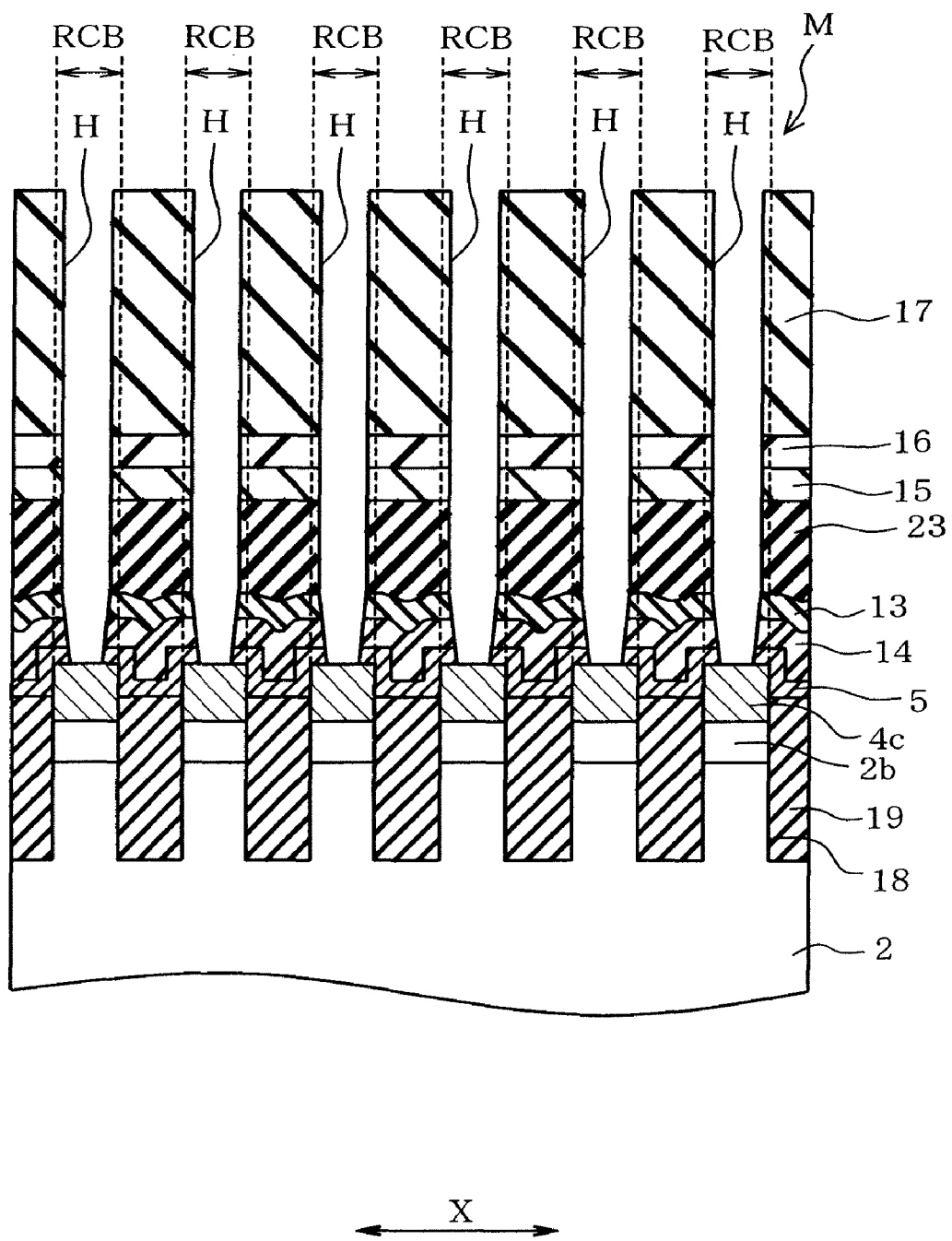

Next, referring to FIGS. 13A and 13B, a through hole H penetrating down to the upper surface of polycrystalline silicon layer 4c is formed for forming bit line contact CB. Since silicon substrate 2 need not be etched, reduced aspect ratio can be employed in the etching process, consequently providing improved processing reliability, and also reducing occurrence of opening and shorting of bit line contact CB. Especially when employing silicon oxide film 23 comprising BPSG, side etch progresses at portions of light density by cleaning after opening hole H. In some occasions, side etching may progress to a point of reaching the neighboring bit line contact CB, and shorting may occur in the neighboring bit line contacts CB by subsequent filling of metal. The present exemplary embodiment restrains progression of side etching by lowering the height of hole H to minimize such problems.

Next, as shown in FIGS. 3A and 3B, titanium (Ti)/titanium nitride (TiN) are formed as barrier metal film 11 by sputtering, whereafter metal layer 12 comprising tungsten is deposited by CVD. Then, the structure is planaraized by CMP to form bit line contact CB comprising a stack of polyplug and metal plug. After successions of steps not described, multilayer interconnect such as interconnect layer serving as bit line BL is formed on bit line contact CB to complete manufacturing of flash memory 1.

According to the present exemplary embodiment, polycrystalline silicon layer 4c serving as a polyplug is provided at the substantial center of the space between the pair of select gate electrodes SG, to maintain Y-directional structural periodicity to the possible extent and to increase lithography process margin. The obtained periodicity allows minimization of inconsistencies in dimensions of polycrystalline silicon layers 4c and select gate electrodes SG and provides the desired form patterns. Thus, even when employing structures having various spacing between conductive layers of elements such as select gate electrodes SG and floating gate electrodes FG, fair periodicity can be obtained for the conductive layers.

Further, unlike the conventional manufacturing method in which silicon substrate 2 is anisotropically etched when forming contact holes for bit line contacts CB, since polycrystalline silicon layer 4c need not be etched, the process requires less amount (reduced height, in this case) of metal layer 12, resulting in improved gap-fill capabilities of metal layer 12.

Since silicon nitride film 13 is formed above polycrystalline silicon layer 4c and not between polycrystalline silicon layer 4c and select gate electrode SG, characteristics of select gate transistor Trs1 can be maintained at a fair level.

Since bit line contact CB is formed by contact between metal (barrier metal film 11 and metal layer 12) and polycrystalline silicon layer 4c, it only requires large dope of impurities to be provided into polycrystalline silicon layer 4c to reduce barrier height and contact resistance.

The present disclosure is not limited to the above described exemplary embodiments but may be modified or expanded as follows.

The present disclosure may be applied to semiconductor devices other than flash memory 1.

Inter-gate insulating film 5 is not limited to ONO film 5 but may be replaced by films that include high-dielectric films such as alumina.

The present disclosure may be applied to other types of contact plugs formed on silicon substrate 2 and is not limited to application to bit line contact CB.

The present exemplary embodiment is configured by floating gate electrodes FG and select gate electrodes SG aligned on silicon oxide film 3 with polycrystalline silicon layer 4c interposing the pair of select gate electrodes SG. However, the present disclosure may be applied to a configuration having ordinary transistors aligned on silicon oxide film 3.

The present exemplary embodiment discloses silicon nitride film 21 and polycrystalline silicon layer 6b and 6a, situated between select gate electrodes SG, being etched after formation of silicon oxide films 9 and 10. Alternatively, etching may be performed prior to formation of silicon oxide films 9 and 10 by forming a mask pattern with openings defined at locations corresponding to portions intervening select gate electrodes SG and etching silicon nitride film 21, polycrystalline silicon layers 6b and 6a below the opening in listed sequence. Such arrangement contributes to reduction in processing steps.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. A method of forming a semiconductor device, including a semiconductor substrate having a first region, a second region and a third region located between the first and second regions, comprising:

forming a gate insulating film on the semiconductor substrate in the first, second and third regions, respectively;

removing the gate insulating film in the second region;

forming a first polycrystalline silicon layer having a first thickness on the gate insulating film in the first and third regions, and directly on a diffusion layer of the semiconductor substrate in the second region, respectively;

forming an inter-gate insulating film on the first polycrystalline silicon layer in the first, second and third regions, respectively, the inter-gate insulating film including an opening in the third region;

forming a second polycrystalline silicon layer having a second thickness on the inter-gate insulating film in the first, second and third regions, respectively, the second polycrystalline silicon layer contacting the first polycrystalline silicon layer through the opening in the third region;

removing the first and the second polycrystalline silicon layers and the inter-gate insulating film situated at a first border portion between the first and third regions and a second border portion between the second and third regions, to form a first gate electrode of a memory cell transistor in the first region, a second gate electrode of a select gate transistor in the third region and a contact plug in the second region;

forming first silicon oxide in the first and second border portions where the first and the second polycrystalline silicon layers and the inter-gate insulating film have been removed;

removing the second polycrystalline silicon layer in the second region to expose the inter-gate insulating film;

forming a second silicon oxide film on the inter-gate insulating film in the second region;

forming a third silicon oxide film above the first and second gate electrodes and the second oxide film;

forming a contact hole penetrating the second and third silicon oxide films and the inter-gate insulating film to expose an upper surface of the first polycrystalline silicon layer in the second region; and forming a metal plug in the contact hole, the metal plug contacting the exposed upper surface of the first polycrystalline silicon layer in the second region.

2. The method of claim 1, further comprising forming a first diffusion layer in the semiconductor substrate in the second region where the gate insulating film have been removed prior to formation of the first polycrystalline silicon layer.

3. The method of claim 2 further comprising forming second diffusion layers in the semiconductor substrate in the first and second border portions where the first and the second polycrystalline silicon layers and the inter-gate insulating film have been removed prior to formation of the first silicon oxide films.

4. The method of claim 1 further comprising forming silicide layers at upper end portions of the first and second gate electrodes after the first and the second polycrystalline silicon layers and the inter-gate insulating film have been removed from the first and second border portions.

5. The method of claim 4 further comprising forming a silicon nitride film between the third silicon oxide film and the silicide layers.

6. The method of claim 5 further comprising forming a fourth silicon oxide film between the silicon nitride film and the silicide layer.

* * * * *